(12) United States Patent
Sampath et al.

(10) Patent No.: US 12,745,419 B2
(45) Date of Patent: Sep. 22, 2026

(54) GATE TRENCH POWER SEMICONDUCTOR DEVICES HAVING SHAPED DEEP SUPPORT SHIELDS THAT REDUCE CELL PITCH AND ON-STATE RESISTANCE

(71) Applicant: Wolfspeed, Inc., Durham, NC (US)

(72) Inventors: Madankumar Sampath, Morrisville, NC (US); Woongsun Kim, Cary, NC (US); Naeem Islam, Morrisville, NC (US); Sei-Hyung Ryu, Cary, NC (US)

(73) Assignee: Wolfspeed, Inc., Durham, NC (US)

(*) Notice: Subject to any disclaimer, the term of this patent is extended or adjusted under 35 U.S.C. 154(b) by 422 days.

(21) Appl. No.: 18/482,105

(22) Filed: Oct. 6, 2023

(65) Prior Publication Data

US 2025/0120119 A1 Apr. 10, 2025

(51) Int. Cl.

| | |
|---|---|
| ***H01L 29/78*** | (2006.01) |
| ***H01L 29/06*** | (2006.01) |
| ***H01L 29/10*** | (2006.01) |
| ***H10D 30/66*** | (2025.01) |
| ***H10D 62/10*** | (2025.01) |
| ***H10D 62/17*** | (2025.01) |

(52) U.S. Cl.

CPC ......... *H10D 30/668* (2025.01); *H10D 62/106* (2025.01); *H10D 62/393* (2025.01)

(58) Field of Classification Search

CPC .. H10D 30/668; H10D 30/66; H10D 30/0297; H10D 30/01; H10D 30/601; H10D 62/107; H10D 62/405; H10D 62/105; H10D 12/481; H10D 12/00; H10D 12/031; H10D 12/01; H10D 62/106; H10D 62/10; H10D 62/393; H10D 62/127; H10D 62/17; H10D 62/8325; H10D 62/832

See application file for complete search history.

(56) References Cited

U.S. PATENT DOCUMENTS

| | | | |
|---|---|---|---|
| 7,514,322 | B2 | 4/2009 | Yilmaz et al. |
| 7,989,882 | B2 | 8/2011 | Zhang et al. |

(Continued)

FOREIGN PATENT DOCUMENTS

| | | | |
|---|---|---|---|
| DE | 112017005693 | T5 | 8/2019 |
| DE | 102017110508 | B4 | 3/2023 |
| WO | 2023183215 | A1 | 9/2023 |

OTHER PUBLICATIONS

Invitation to Pay Additional Fees and, Where Applicable, Protest Fee, for corresponding Application No. PCT/US2024/045455, dated Dec. 4, 2024, 19 pages.

(Continued)

*Primary Examiner* — Nikolay K Yushin

(74) *Attorney, Agent, or Firm* — Myers Bigel, P.A.

(57) ABSTRACT

A semiconductor device comprises a silicon carbide based semiconductor layer structure and a first gate trench extending into an upper portion of the semiconductor layer structure. The semiconductor layer structure comprises a drift region having a first conductivity type, a well layer having a second conductivity type, and a support shield having the second conductivity type. A width of a first segment of the support shield that is deeper in the semiconductor layer structure than the well layer and less deep in the semiconductor layer structure than a bottom of the first gate trench decreases with increasing distance from the well region.

22 Claims, 13 Drawing Sheets

(56) References Cited

U.S. PATENT DOCUMENTS

| | | | | |
|---|---|---|---|---|
| 9,024,379 | B2 * | 5/2015 | Darwish .............. | H10D 62/393 257/334 |
| 9,048,118 | B2 | 6/2015 | Darwish et al. | |
| 11,075,264 | B2 | 7/2021 | Van Brunt et al. | |
| 11,640,990 | B2 | 5/2023 | Lichtenwalner et al. | |
| 2014/0042535 | A1 * | 2/2014 | Darwish ........... | H01L 21/26506 257/334 |
| 2019/0198622 | A1 | 6/2019 | Uchida et al. | |
| 2023/0307529 | A1 | 9/2023 | Kim et al. | |

OTHER PUBLICATIONS

"Disruptive Technology: ROHM Generation 4 SiC MOSFET, EE Times Asia, Jul. 7, 2022, downloaded from https://www.eetasia.com/express/disputive-technology-rohm-generation-4-sic-mosfet/".

"Notification of Transmittal of the International Search Report and the Written Opinion of the International Searching Authority, or the Declaration for corresponding International Application No. PCT/US2024/045455, mailing date. Jan. 28, 2025, (25 pages)".

"International Preliminary Report of Patentability, for corresponding PCT Application No. PCT/US2024/045455, dated Apr. 7, 2026, 15 pages".

* cited by examiner 100E
190
188
140
$n^+$
$n^+$
$n^+$
184
130
$p$
$p$
180
122
D2
D3
$n^-$
182
$p^+$
$p^+$
150
$p^+$
152
160
$n^-$ Drift
120
z
$n^+$ Substrate
110
y
106
x

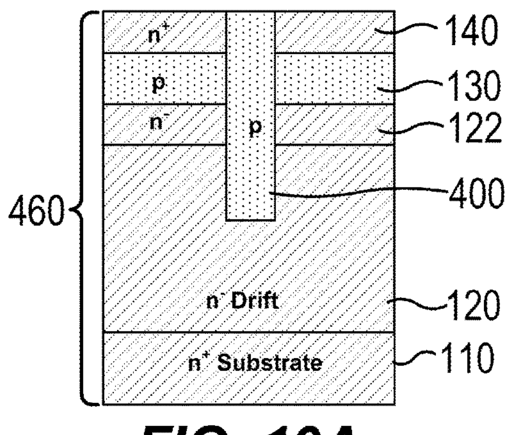
FIG. 10A
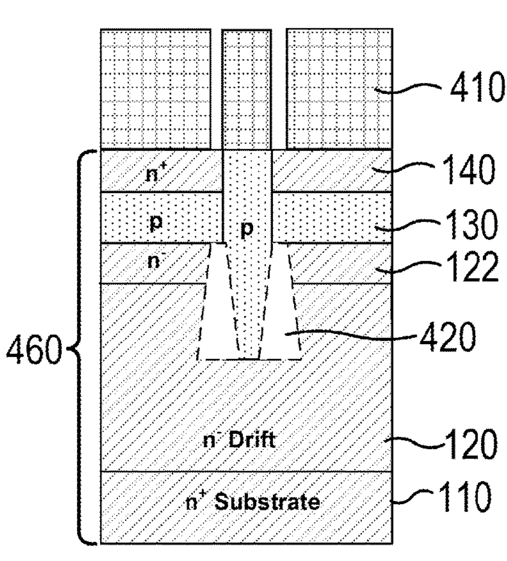
FIG. 10B
$n^+$
p
p
$n^-$
$n^-$
$n^-$
$n^-$ Drift
$n^+$ Substrate
140
130
122
460
420
120
110
FIG. 10C

GATE TRENCH POWER SEMICONDUCTOR DEVICES HAVING SHAPED DEEP SUPPORT SHIELDS THAT REDUCE CELL PITCH AND ON-STATE RESISTANCE

FIELD OF THE INVENTION

The present invention relates to power semiconductor devices and, more particularly, to power semiconductor devices having gate trenches and to methods of fabricating such devices.

BACKGROUND

The Metal Oxide Semiconductor Field Effect Transistor ("MOSFET") is a well-known type of semiconductor transistor that may be used as a switch. A MOSFET is a three terminal device that has gate, drain and source terminals and a semiconductor body. The semiconductor body is referred to herein as a "semiconductor layer structure" and may include one or more semiconductor layers/regions. A source region and a drain region are formed in the semiconductor layer structure that are separated by a channel region. A gate electrode (which may act as the gate terminal or be electrically connected to the gate terminal) is disposed adjacent the channel region and separated from the channel region by a thin oxide layer. A MOSFET may be turned on or off by setting a bias voltage that is applied to the gate electrode to be above or below a threshold value. When a MOSFET is turned on (i.e., it is in its "on-state"), current is conducted through the channel region between the source and drain regions. When the bias voltage is reduced below the threshold level, the current ceases to conduct through the channel region.

An n-type MOSFET has source and drain regions that have n-type (electron) conductivity and a channel region that has p-type (hole) conductivity (i.e., an "n-p-n" design). An n-type MOSFET turns on when a gate bias voltage is applied to the gate electrode that is sufficient to create a conductive n-type inversion layer in the p-type channel region, thereby electrically connecting the n-type source and drain regions and allowing for majority carrier conduction therebetween. A p-type MOSFET has a "p-n-p" design (i.e., p-type source and drain regions and an n-type channel region) and turns on when a gate bias voltage is applied to the gate electrode that is sufficient to create a conductive p-type inversion layer in the n-type channel region to electrically connect the p-type source and drain regions. Herein, the terms "first conductivity type" and "second conductivity type" are used to indicate either n-type or p-type, where the first and second conductivity types are different. Thus, if a first region of a device has a first conductivity type and a second region of the device has a second conductivity type, this means either that the first region has n-type conductivity and the second region has p-type conductivity or, alternatively, that first region has p-type conductivity and the second region has n-type conductivity.

As noted above, the gate electrode of a MOSFET is separated from the channel region by a thin oxide layer that is called a gate oxide layer. Other non-oxide gate dielectric layers may be used in certain applications in place of the gate oxide layer. It will be appreciated that the techniques according to embodiments of the present invention that are described herein are equally applicable to devices having gate dielectric layers formed with materials other than oxides.

Because the gate electrode of a MOSFET is insulated from the channel region by the gate oxide layer, minimal gate current is required to maintain the MOSFET in its on-state or to switch the MOSFET between its off-state and its on-state. The gate current is kept small during switching because the gate forms a capacitor with the channel region. Thus, only minimal charging and discharging current is required during switching, allowing for less complex gate drive circuitry and faster switching speeds. MOSFETs may be stand-alone devices or may be combined with other circuit devices. For example, an Insulated Gate Bipolar Transistor ("IGBT") is a semiconductor device that includes both a MOSFET and a Bipolar Junction Transistor ("BJT") that combines the high impedance gate electrode of the MOSFET with the small on-state conduction losses that may be provided by a BJT. An IGBT may be implemented, for example, as a Darlington pair that includes a high voltage n-channel MOSFET at the input and a BJT at the output. The base current of the BJT is supplied through the channel of the MOSFET, thereby allowing a simplified external drive circuit (since the drive circuit only charges and discharges the gate electrode of the MOSFET).

In some applications, MOSFETs may need to carry large currents and/or be capable of blocking high voltages. Such MOSFETs are often referred to as "power" MOSFETs. Power MOSFETs are often fabricated from wide band-gap semiconductor materials (herein, the term "wide band-gap semiconductor" encompasses any semiconductor having a band-gap of at least 1.4 eV). Power semiconductor devices are often formed in silicon carbide ("SiC"), which has a number of advantageous characteristics including, for example, a high electric field breakdown strength, high thermal conductivity, high electron mobility, high melting point and high-saturated electron drift velocity.

Power semiconductor devices such as power MOSFETs can have a lateral structure or a vertical structure. In a device having a lateral structure, the terminals of the device (e.g., the drain, gate and source terminals for a power MOSFET) are on the same major surface (i.e., top or bottom) of a semiconductor layer structure. In contrast, in a device having a vertical structure, at least one terminal is provided on each major surface of the semiconductor layer structure (e.g., in a vertical MOSFET, the source and gate may be on the top surface of the semiconductor layer structure and the drain may be on the bottom surface of the semiconductor layer structure). The semiconductor layer structure may or may not include an underlying substrate such as a growth substrate.

The semiconductor layer structure of a power semiconductor device typically includes an "active region" in which one or more functional semiconductor devices are formed. The active region acts as a main junction for blocking voltage during reverse bias (off-state) operation and for providing current flow during forward bias (on-state) operation. The power semiconductor device may also have an edge termination structure such as guard rings or a junction termination extension in a termination region of the semiconductor layer structure that is adjacent (and typically surrounding) the active region. The edge termination structure may, among other things, reduce electric field crowding effects that can occur at the outer edges of a power semiconductor device. Typically, multiple power semiconductor devices are formed in/on a common wafer, and each power semiconductor device will typically have its own edge termination structure. After the wafer is fully processed, the resultant structure may be diced to separate the individual edge-terminated power semiconductor devices. Each power semiconductor device may have a unit cell structure in which the active region of each power semiconductor device includes a plurality of individual "unit cell" devices that are electrically connected in parallel and that together function as a single power semiconductor device.

Vertical power semiconductor devices that include a MOSFET can have a planar gate electrode design in which the gate electrode of the transistor is formed on top of the semiconductor layer structure or, alternatively, may have the gate electrode in a gate trench within the semiconductor layer structure, which are typically referred to as gate trench MOSFETs. With the planar gate electrode design, the channel region of each unit cell transistor is horizontally disposed underneath the gate electrode. In contrast, in the gate trench MOSFET design, the channels are typically vertically disposed adjacent sidewalls of the gate electrodes. Gate trench MOSFETs may provide enhanced performance, but typically require a more complicated manufacturing process.

One failure mechanism for a power MOSFET is the so-called "breakdown" of the gate oxide layer. The gate oxide layer is subjected to high electric fields during normal device operation. The stress on the gate oxide layer caused by these electric fields generates defects in the oxide material, and these defects build up over time. When the concentration of defects reaches a critical value, a so-called "percolation path" may be created through the gate oxide layer that electrically connects the gate electrode to the source or drain region, thereby creating a short-circuit that can destroy the device. The "lifetime" of a gate oxide layer (i.e., how long the device can be operated before breakdown occurs) is a function of, among other things, the magnitude of the electric field that the gate oxide layer is subjected to and the length of time for which the electric field is applied. FIG. 1 is a schematic graph illustrating the relationship between the operating time until breakdown occurs (the "gate oxide lifetime") and the level of the electric field applied to the gate oxide layer. This graph assumes that the same electric field is always applied (which is not necessarily the case). As shown in FIG. 1, the relationship may, in some cases, be generally linear when the gate oxide lifetime is plotted on a logarithmic scale. The important point to take from FIG. 1 is that as the electric field level is increased, the lifetime of the gate oxide layer decreases exponentially. The lifetime of the gate oxide layer may be increased by increasing the thickness of the gate oxide layer, but various performance parameters of a MOSFET may be a function of the thickness of the gate oxide layer and thus increasing the thickness of the gate oxide layer is typically not an acceptable way of increasing the lifetime of the gate oxide layer.

SUMMARY

Pursuant to some embodiments of the present invention, semiconductor devices are provided that comprise a silicon carbide based semiconductor layer structure that comprises a drift region having a first conductivity type, a well layer having a second conductivity type, and a support shield having the second conductivity type and a first gate trench extending into an upper portion of the semiconductor layer structure. A width of a first portion of the support shield decreases with increasing distance from the well region.

In some embodiments, the first portion of the support shield comprises a portion that is deeper in the semiconductor layer structure than the well layer and less deep in the semiconductor layer structure than a bottom of the first gate trench.

In some embodiments, an entirety of the support shield that is deeper in the semiconductor layer structure than the well layer has a width that decreases with increasing distance from the well region.

In some embodiments, a bottom of the first gate trench has a first depth from the upper portion of the semiconductor layer structure and a bottom of the support shield has a second depth from the upper portion of the semiconductor layer structure, where the second depth is greater than the first depth. In some embodiments, the semiconductor layer structure further comprises a trench shielding region having the second conductivity type below the first gate trench, where a bottom of the trench shielding region has a third depth from the upper portion of the semiconductor layer structure, and wherein the second depth is greater than the third depth.

In some embodiments, the semiconductor layer structure further comprises a buried support shield extension that extends laterally from the support shield.

In some embodiments, the semiconductor device comprise a MOSFET, and the semiconductor layer structure further comprises a source layer having the first conductivity type on the well layer, and wherein a gate oxide layer and a gate electrode are in the first gate trench, with the gate oxide layer between the gate electrode and the semiconductor layer structure.

In some embodiments, a maximum width of a portion of the support shield that horizontally overlaps the source region is at least 10% larger than a width of a portion of the support shield that horizontally overlaps a bottom of the first gate trench.

In some embodiments, the semiconductor device further comprises a second gate trench extending into the upper portion of the semiconductor layer structure, wherein the support shield is in between the first and second gate trenches.

In some embodiments, a support shield trench is provided in the semiconductor layer structure that extends at least part of the way through the support shield, and conductive material other than silicon carbide is in the support shield trench. In some embodiments, the conductive material may be doped polysilicon, nickel oxide or a metal that makes a Schottky contact to silicon carbide.

In some embodiments, the support shield trench does not extend through a bottom surface of the support shield.

Pursuant to further embodiments of the present invention, semiconductor devices are provided that comprise a silicon carbide based semiconductor layer structure that comprises a drift region having a first conductivity type, a JFET region having the first conductivity type on an upper portion of the drift region, the JFET region having a higher first conductivity type doping concentration than the drift region, a well layer having a second conductivity type on an upper portion of the JFET region, and a support shield having the second conductivity type. A first gate trench extends into an upper portion of the semiconductor layer structure. A first portion of the JFET region that is in between the first gate trench and the support shield has a width that increases with increasing distance from the well layer.

In some embodiments, at least a portion of the support shield has a width that decreases with increasing distance from the upper portion of the semiconductor layer structure.

In some embodiments, a bottom of the first gate trench has a first depth from the upper portion of the semiconductor layer structure and a bottom of the support shield has a second depth from the upper portion of the semiconductor layer structure, where the second depth is greater than the first depth.

In some embodiments, the semiconductor layer structure further comprises a trench shielding region having the second conductivity type below the first gate trench, wherein a bottom of the trench shielding region has a third depth from the upper portion of the semiconductor layer structure, and wherein the second depth is greater than the third depth.

In some embodiments, the semiconductor layer structure further comprises a buried support shield extension that extends laterally from the support shield. In some embodiments, the support shield extension extends laterally for a distance of between 0.1 and 5.0 microns. In some embodiments, the support shield extension has a thickness of between 0.1 and 20 microns.

In some embodiments, the semiconductor device comprise a MOSFET, and the semiconductor layer structure further comprises a source layer having the first conductivity type on the well layer, and wherein a gate oxide layer and a gate electrode are in the first gate trench, with the gate oxide layer between the gate electrode and the semiconductor layer structure.

In some embodiments, the semiconductor device comprise a MOSFET, and the semiconductor layer structure further comprises a source layer having the first conductivity type on the well layer, wherein a maximum width of a portion of the support shield that horizontally overlaps the source layer is at least 10% larger than a width of a portion of the support shield that horizontally overlaps a bottom of the first gate trench.

In some embodiments, the semiconductor device further comprises a second gate trench extending into the upper portion of the semiconductor layer structure, wherein the support shield is in between the first and second gate trenches.

In some embodiments, a support shield trench is provided in the semiconductor layer structure that extends at least part of the way through the support shield, and conductive material other than silicon carbide is in the support shield trench. In some embodiments, the conductive material comprises one of doped polysilicon, nickel oxide, or a metal that makes a Schottky contact to silicon carbide.

In some embodiments, the support shield trench does not extend through a bottom portion of the support shield.

Pursuant to additional embodiments of the present invention, semiconductor devices are provided that comprise a silicon carbide based semiconductor layer structure that comprises a drift region having a first conductivity type, a support shield having the second conductivity type, and a buried lateral support shield extension having the second conductivity type that extends laterally from the support shield. A first gate trench extending into an upper portion of the semiconductor layer structure. A sidewall of the support shield extends along a crystallographic axis of the semiconductor layer structure.

In some embodiments, sidewalls of buried lateral support shield extension do not extend along a crystallographic axis of the silicon carbide semiconductor layer structure. In some embodiments, the crystallographic axis is one of the <11-23>, <–1-123>, <1-213>, <–12-13>, <2-1-13> or <–2113> crystallographic axes. In other embodiments, the crystallographic axis is the <0001> crystallographic axis.

In some embodiments, at least a portion of first and second sidewalls of the support shield angle inwardly with increasing depth into the semiconductor layer structure.

In some embodiments, the semiconductor layer structure further comprises a JFET region having the first conductivity type in between the drift region and the well region and in between the support shield and the first gate trench, wherein a minimum distance between the buried lateral support shield extension and the trench shield is at least as large as a minimum lateral width of the JFET region.

In some embodiments, the semiconductor layer structure further comprises a trench shielding region having the second conductivity type below the first gate trench, and an upper portion of the support shield extension is deeper into the semiconductor layer structure than is a bottom surface of the trench shielding region.

In some embodiments, the buried support shield extension extends laterally for a distance of between 0.1 and 20 microns from the support shield.

In some embodiments, the semiconductor device further comprises a second gate trench extending into the upper portion of the semiconductor layer structure, wherein the support shield is in between the first and second gate trenches.

Pursuant to still further embodiments of the present invention, methods of fabricating a semiconductor device are provided. Pursuant to these methods, a semiconductor layer structure is provided that comprises a drift region having a first conductivity type. First and second gate trenches are formed in the semiconductor layer structure. A mask that includes an opening is formed on an upper portion of the semiconductor layer structure, wherein at least one of the sidewalls of the mask that define the opening is an angled sidewall that defines an obtuse angle with respect to the upper portion of the semiconductor layer structure exposed through the opening. Second conductivity dopants are implanted into the semiconductor layer structure using the mask as an ion implantation shield to form a support shield having a second conductivity type in between the first and second gate trenches.

In some embodiments, the obtuse angle is an angle between 100° and 1600.

In some embodiments, a width of the support shield decreases with increasing distance from an upper portion of the semiconductor layer structure.

In some embodiments, a bottom of the first gate trench has a first depth from the upper portion of the semiconductor layer structure and a bottom of the support shield has a second depth from the upper portion of the semiconductor layer structure, where the second depth is greater than the first depth.

In some embodiments, the semiconductor layer structure further comprises a trench shielding region having the second conductivity type below the first gate trench, where a bottom of the trench shielding region has a third depth from the upper portion of the semiconductor layer structure, and wherein the second depth is greater than the third depth.

In some embodiments, the method further comprises implanting second conductivity type dopants into the semiconductor layer structure to form a buried support shield extension that extends laterally from the support shield.

In some embodiments, he second conductivity type dopants that are implanted into the semiconductor layer structure to form the buried support shield extension are implanted using a random ion implantation process.

In some embodiments, the second conductivity type dopants that are implanted into the semiconductor layer structure to form the support shield are implanted using a channeled ion implantation process.

In some embodiments, the second conductivity type dopants that are implanted into the semiconductor layer structure to form the support shield are implanted using a channeled ion implantation process.

In some embodiments, the semiconductor layer structure further comprises a well layer having the second conductivity type on the drift region, and a source layer having the first conductivity type on the well layer, and wherein a maximum width of a portion of the support shield that horizontally overlaps the source region is at least 10% larger than a width of a portion of the support shield that horizontally overlaps a bottom of the first gate trench.

Pursuant to yet additional embodiments of the present invention, methods of fabricating a semiconductor device are provided in which a semiconductor layer structure is provided that comprises a drift region having a first conductivity type. First and second gate trenches are formed in the semiconductor layer structure. A support shield structure is formed in the semiconductor layer structure by implanting second conductivity dopants into the semiconductor layer structure using both a non-channeled ion implantation process and a channeled ion implantation process.

In some embodiments, a same ion implantation mask is used for both the non-channeled ion implantation process and the channeled ion implantation process.

In some embodiments, the support shield structure comprises a support shield that is formed by the channeled ion implantation process and a buried lateral support shield extension that is formed by the non-channeled ion implantation process.

In some embodiments, the channeled ion implantation process is performed along one of the <0001>, <11-23>, <−1-123>, <1-213>, <−12-13>, <2-1-13> or <−2113> crystallographic axes.

Pursuant to still other embodiments of the present invention, methods of fabricating a semiconductor device are provided. Pursuant to these methods, a semiconductor layer structure is provided that comprises a drift region having a first conductivity type. Second conductivity dopants are implanted into the semiconductor layer structure to form a preliminary support shield. First conductivity dopants are implanted into the semiconductor layer structure to convert outer portions of the preliminary support shield into first conductivity type material to form a support shield that has a first sidewall, where at least a portion of the first sidewall angles inwardly with increasing depth into the semiconductor layer structure.

In some embodiments, the second conductivity dopants are implanted into the semiconductor layer structure using a channeled ion implantation process.

In some embodiments, the first conductivity dopants are implanted into the semiconductor layer structure using a random ion implantation process.

In some embodiments, the second conductivity dopants are implanted into the semiconductor layer structure using a random ion implantation process and the first conductivity dopants are implanted into the semiconductor layer structure using a random ion implantation process.

BRIEF DESCRIPTION OF THE DRAWINGS

FIGS. 10A-10C illustrate another process according to embodiments of the present invention that may be used to form support shields that have sidewalls that angle inwardly with increasing depth.

DETAILED DESCRIPTION

Figure 1:
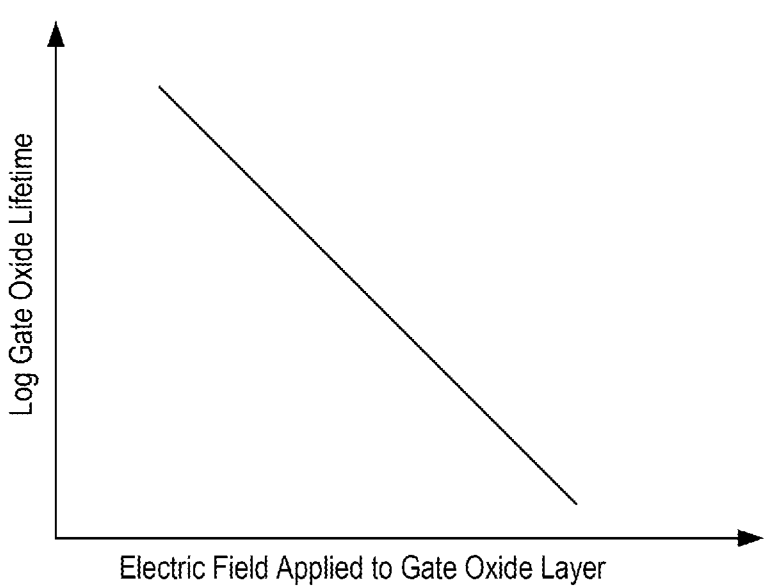
FIG. 1 is a semi-log graph illustrating the relationship between the lifetime of the gate oxide layer as a function of applied electric field strength.

Vertical silicon carbide based power semiconductor devices that have gate trenches such as vertical power MOSFETs and IGBTs are attractive for many applications due to their inherent lower specific on-resistance, which may result in more efficient operation for power switching operations. The channels in a gate trench vertical power device are formed in the sidewalls of the gate trenches, and hence are vertical channels. The carrier mobility in these vertically-oriented sidewall channels may be about 2-4 times higher than the corresponding carrier mobility in the horizontal channel of a standard planar gate (i.e., non-gate trench) vertical power device, which results in increased current density during on-state operation allowing for higher switching speeds. The gate trench design also reduces the overall pitch of the device, which increases device integration. The lower conduction losses (due to the reduced on-state resistance) and improved switching speeds make gate trench power devices particularly well-suited for high frequency power applications having low to moderate voltage blocking requirements (e.g., 600-1200 Volts). These devices may have reduced requirements for associated passive components and require relatively simple cooling schemes. As MOSFETs are the most widely used silicon carbide based gate trench power semiconductor devices, the discussion below focuses on MOSFET embodiments. It will be appreciated, however, that each of the described embodiments may alternatively be implemented using non-oxide gate dielectric layers (e.g., nitrides, high dielectric constant materials, etc.), and that the same techniques may be used to form other gate trench power semiconductor devices such as IGBTs, gate-controlled thyristors and the like.

As discussed above, gate trench power MOSFETs are susceptible to oxide reliability issues due to the presence of high electric fields in the gate oxide layers that line the bottoms and sidewalls of the gate trenches. The high electric fields degrade the gate oxide layer over time, and may eventually result in failure of the device. When gate trench MOSFETs operate in reverse blocking operation (i.e., when the MOSFET is in its off-state), the source terminal of the MOSFET is typically grounded, the gate terminal is typically grounded or at a negative bias voltage, and the drain terminal is typically at a high positive voltage. During such reverse blocking operations, high electric fields extend upwardly from the drain terminal (which is on the bottom surface of the semiconductor layer structure) toward the top surface of the semiconductor layer structure. Thus, under reverse blocking operation, the bottom portion of the gate dielectric layer experiences the highest electric field levels. Due to electric field crowding effects, the electric field levels in the lower "corners" of the gate oxide layer at the bottom edges of the gate trench may be particularly high (i.e., the portions of the gate oxide layers that cover the region where the sidewalls of the gate trenches merge into the bottom of the gate trenches). Moreover, due to the difference in permittivity between silicon carbide and silicon oxide, the electric field in a silicon oxide gate oxide layer may be about 2.6 times higher than the electric field in the silicon carbide semiconductor layer structure adjacent the gate oxide layer. Breakdown of the silicon oxide occurs when the electric field reaches a critical level. In order to avoid such breakdown, power MOSFETs may be operated with the drain voltage at lower levels during reverse blocking operation to ensure that the electrical field does not reach a level that will result in breakdown. In other words, the voltage rating of a power MOSFET may be set to ensure that premature gate oxide breakdown will not occur.

So-called "trench shielding regions" (also called "trench shields" or "bottom shields") are often provided underneath the gate trenches of gate trench power MOSFETs in order to reduce the electric field levels in the gate oxide layer during reverse blocking operation. These trench shielding regions are formed by doping the portions of the semiconductor layer structure underneath the gate trenches with dopants having the same conductivity type as the dopants included in the channel regions of the device. The trench shielding regions are typically formed via one or more ion implantation processes in which p-type dopant ions (for an n-type MOSFET) are implanted through the bottom surfaces of the gate trenches. The trench shielding regions may, for example, extend downwardly 0.5 to 1.0 microns or more from the bottoms of the gate trenches into the semiconductor layer structure of the device, and are moderately to highly doped regions. The trench shielding regions are electrically connected to the source terminal of the MOSFET by p-type trench shielding region connection patterns. These trench shielding connection patterns may be in and/or outside the active region of the device.

More recently, gate trench power MOSFETs have been suggested that include additional shielding regions that are referred to as "support shields." The support shields are formed in the semiconductor layer structure between adjacent gate trenches and, like the trench shielding regions, may comprise highly doped semiconductor regions having the same conductivity type as the channel regions of the MOSFET. The support shields may, for example, extend to the same depth in the semiconductor layer structure as the trench shielding regions and may be formed by a high-energy ion implantation process. The support shields may directly connect to the source metallization in the active region of the device.

Figure 2:
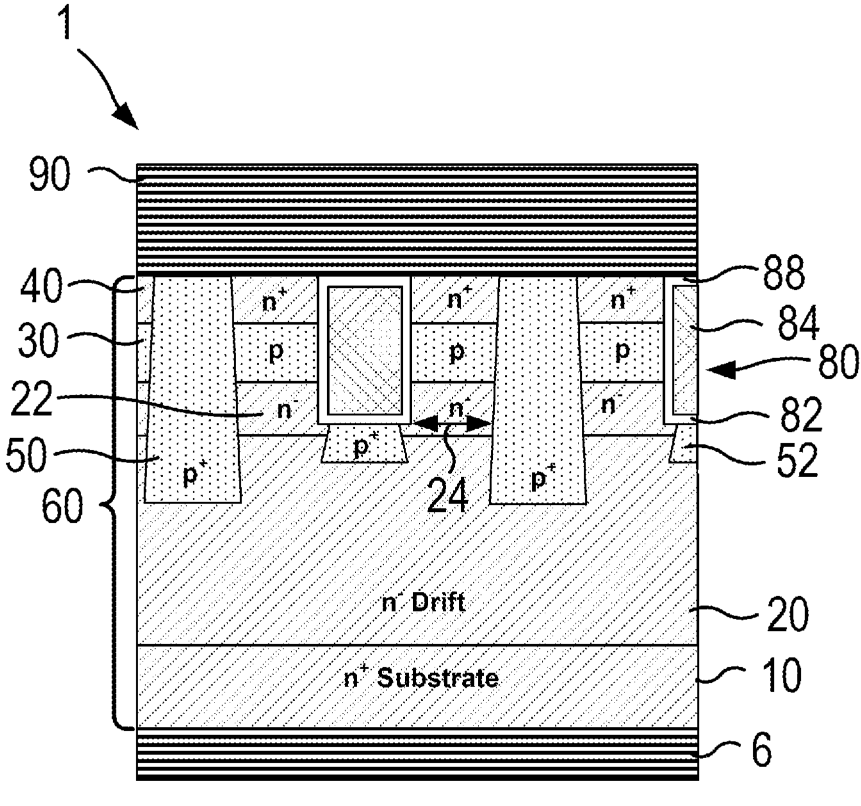
FIG. 2 is a schematic cross-sectional view of a unit cell of a gate trench power MOSFET having support shields.

FIG. 2 is a schematic cross-sectional view of a small portion of a silicon carbide power MOSFET 1 that includes support shields. The cross-section of FIG. 2 shows one full unit cell of the MOSFET 1 and portions of two adjacent unit cells. As shown in FIG. 2, the MOSFET 1 includes a heavily-doped n-type (n+) silicon carbide semiconductor substrate 10. A lightly-doped n-type ($n^-$) silicon carbide drift region 20 is provided on the upper surface of the substrate 10. An n-type silicon carbide JFET region 22 is formed in the upper portion of the drift region 20. The JFET region 22 may be more heavily doped than the remainder of the drift region 20. Moderately-doped (p) silicon carbide p-type wells 30 (also referred to as "p-wells") are provided on the upper surface of the n-type JFET region 22. Heavily-doped ($n^+$) n-type silicon carbide source regions 40 are formed in upper portions of the p-wells 30. The substrate 10, drift region 20, p-wells 30, and source regions 40 are part of a semiconductor layer structure 60 of the MOSFET 1.

The semiconductor layer structure 60 further includes p-type support shields 50 that extend downwardly from an upper portion (e.g., the upper surface) of the semiconductor layer structure 60. The p-type support shields 50 may be moderately (p) or heavily doped ($p^+$) silicon carbide regions. As is further shown in FIG. 2, plurality of gate trenches 80 are formed in the upper portion of the semiconductor layer structure 60. The semiconductor layer structure 60 also includes p-type trench shielding regions 52 that are formed underneath the respective gate trenches 80, typically by implanting p-type dopants through the bottoms of the gate trenches 80. The p-type trench shielding regions 52 extend underneath the respective gate trenches 80 for all or substantially all of the length of the gate trench 80 and may be moderately (p) or heavily doped ($p^+$) silicon carbide regions. The p-type support shields 50 and the p-type trench shielding regions 52 act to reduce the electric field levels that form in gate oxide layers (discussed below) during reverse blocking operation.

A gate oxide layer 82 is formed conformally within each gate trench 80, and gate electrodes 84 are formed in the gate trenches 80 on the gate oxide layers 82. An intermetal dielectric pattern 88 covers the gate electrodes 84. A source metallization layer 90 is formed on the intermetal dielectric pattern 88 and on the heavily-doped n-type source regions 40 and upper portions of the support shields 50. A drain contact 6 is formed on the lower surface of the substrate 10

As shown, the p-type support shields 50 may extend downwardly part or all of the way through the JFET region 22. Likewise, the gate trenches 80 and the p-type trench shielding regions 52 thereunder may also extend downwardly part or all of the way through the JFET region 22. As a result, the JFET region 22 may horizontally overlap the p-type support shields 50 and one or both of the gate trenches 80 and the p-type trench shielding regions 52. As used herein, two elements of a semiconductor device are considered to "horizontally overlap" if an axis that is parallel to the major surfaces of a semiconductor layer structure of the semiconductor device intersects both elements.

As shown in FIG. 2, the minimum width of the JFET region 22 in between a p-type support shield 50 and an adjacent gate trench 80 (or p-type trench shielding region 52) is referred to as the JFET gap 24. Since during on-state operation the source-to-drain current flows through these JFET gaps 24, the width of the JFET gap 24 has a direct impact on the on-state resistance of MOSFET 1.

While the provision of support shields 50 in gate trench power MOSFET 1 may provide increased protection to the gate oxide layer 82, the support shields 50 may increase the "pitch" of the MOSFET 1. In particular, the pitch of a power MOSFET refers to the distance between adjacent unit cells. When support shields are added to a gate trench power MOSFET, it may be necessary to increase the spacing between adjacent gate trenches 80 to make room for the support shields 50, thereby increasing the pitch, which reduces the integration level of the MOSFET. Adding support shields 50 to MOSFET 1 also typically adds several additional processing steps (e.g., masking, ion implantation and/or mask removal steps), which increases fabrication costs. Thus, there are tradeoffs involved in adding support shields 50 to a gate trench power MOSFET or other power semiconductor device.

Pursuant to embodiments of the present invention, gate trench silicon carbide power MOSFETs (and other power semiconductor devices) are provided that have improved support shield designs. For example, in some embodiments, the support shields may be shaped using special ion implantation techniques to allow the cell pitch and/or the on-state resistance of the MOSFET to be reduced. Thus, the power MOSFETs according to embodiments of the present invention may exhibit reduced fabrication costs and/or improved performance.

It has been discovered that providing deep support shields may provide additional advantages above and beyond protecting the gate oxide layers in the gate trenches during reverse bias operation. In particular, if the support shields extend further (i.e., deeper) into the semiconductor layer structure than the trench shielding regions that are provided beneath the gate trenches, then the support shields may act as the current paths for avalanche breakdown currents, displacement currents and body diode currents instead of the trench shielding region that is provided beneath the gate trench. This advantageously routes those currents away from the channel region of the device. However, when standard ion implantation processes are used to form the support shields, the width of the support shield tends to increase with increasing depth into the semiconductor layer structure as the deeper the implant the more opportunities for the implanted dopant ions to collide with atoms in the crystal lattice and be redirected laterally. This phenomena is sometimes referred to as "blooming." The blooming phenomena can be seen with reference to FIG. 2 above, which shows that the deep support shields 50 have sidewalls that angle outwardly with increasing depth. The lateral expansion of the support shields 50 acts to decrease the widths of the JFET gaps 24, thereby forcing the current to flow through a narrowed region, which acts to increase the on-state resistance. The distances between each gate trench 80 and its associated support shields 50 may therefore be set to meet a desired on-state resistance value. This, however, may require increasing the spacing between the support shields 50 and the gate trenches 80 in order to obtain a sufficiently large JFET gap 24, which disadvantageously increases the cell pitch of the power MOSFET 1.

In some embodiments of the present invention, gate trench silicon carbide based power MOSFETs (and other gate trench power semiconductor devices) are provided that have support shields that have substantially vertical sidewalls or sidewalls that are angled inwardly with increasing depth. As such, the JFET gaps in these devices either remains constant or actually increase with increasing depth. As a result, the unit cells of the power MOSFETs according to embodiments of the present invention may be packed together more tightly while providing the same or even improved on-state resistance performance.

In some embodiments, ion implantation masks that have angled sidewalls are used in conjunction with a channeled ion implantation process to form the support shields. Channeled ion implants may exhibit significantly less blooming than random (standard) ion implants that are not performed along channels in the semiconductor crystal lattice. Moreover, since the dopant ions that are implanted into the angled sidewalls of the ion implantation mask will only travel through part of the thickness of the mask, some of these dopant ions will pass all the way through the mask and into the semiconductor layer structure, with dopant ions that are implanted into the thinner outer portions of the angled sidewalls of the mask being more likely to pass through the mask and into the semiconductor layer structure than dopant ions that are implanted into the thicker inner portion of the angled sidewalls. Moreover, dopant ions that are implanted though the mask and into the semiconductor layer structure will tend to implant less deeply into the semiconductor layer structure, since collisions with atoms in the mask act to reduce the energy of the dopant ions. The net result is that this technique may be used to form support shields that have decreasing widths with increasing depth in the semiconductor layer structure. As such, the distance between the upper surface of the support shields and the adjacent gate trenches may be reduced, thereby decreasing the pitch of the device.

In other embodiments, channeled ion implantation techniques may be used with conventional ion implantation masks that have substantially vertical sidewalls. If the conditions of the channeled implant are carefully controlled, it is possible to form support shields that have generally vertical sidewalls (i.e., little to no blooming). This also allows the pitch of the device to be reduced.

Pursuant to still further embodiments of the present invention, gate trench silicon carbide based power MOSFETs (and other gate trench power semiconductor devices) are provided that have support shields that have lateral support shield extensions extending from (or near) the bottom of the support shields. In some embodiments, these lateral support shield extensions may be formed at a depth below the bottom of the gate shields so that they do not reduce the width of the current path between the JFET region and the drift region while at the same time allowing the support shields to extend closer to being underneath the bottom corners of the gate trenches where they can provide enhanced protection to the gate oxide layer that extends around the bottom corners of the gate trenches. This technique can further improve the reliability of the device without negatively impacting the on-state resistance. Moreover, the support shields may be formed by the processes discussed above so that the support shield have constant or decreasing widths with increasing depth in the semiconductor layer structure or vertical sidewalls.

Embodiments of the present invention will now be described in more detail with reference to FIGS. 3A-10C. It will be appreciated that features of the different embodiments disclosed herein may be combined in any way to provide many additional embodiments. Thus, it will be appreciated that various features of the present invention are described below with respect to specific examples, but that these features may be added to other embodiments and/or used in place of example features of other embodiments to provide many additional embodiments. Thus, the present invention should be understood to encompass these different combinations. Additionally, while the example embodiments focus on MOSFET implementations, it will be appreciated that the same techniques may be used in other gate trench power semiconductor devices such as insulated gate bipolar transistors (IGBTs), gate controlled thyristors and the like.

Figure 3A:
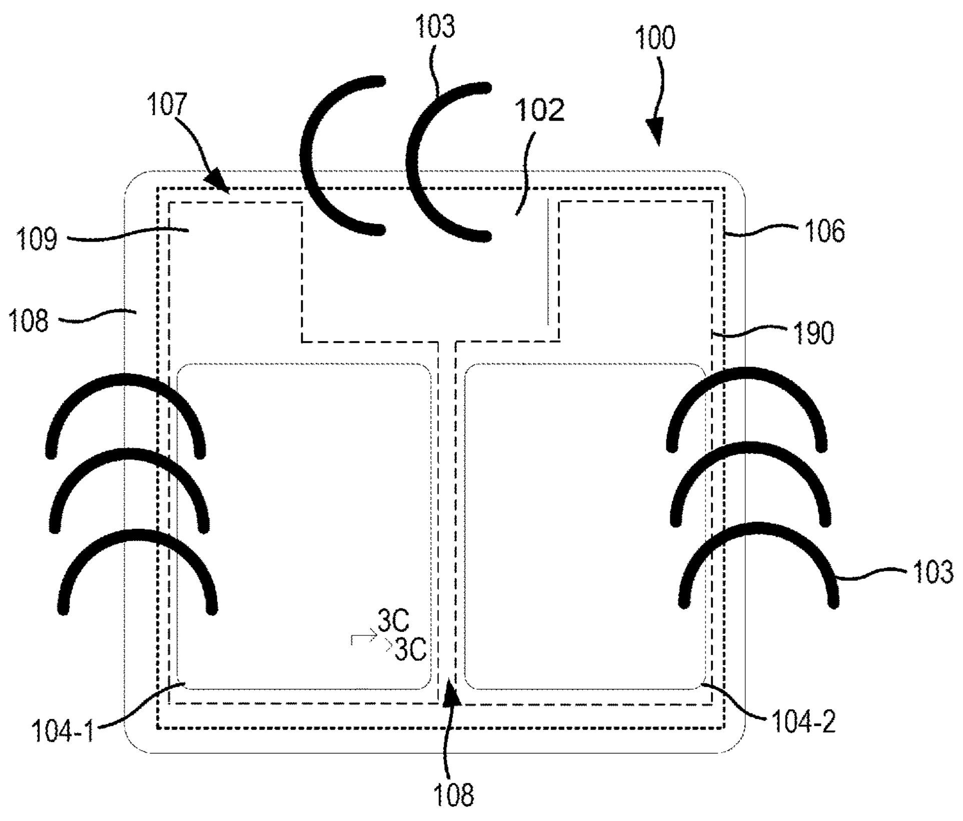
FIG. 3A is a schematic top view of a gate trench silicon carbide power MOSFET according to certain embodiments of the present invention.
Figure 3C:
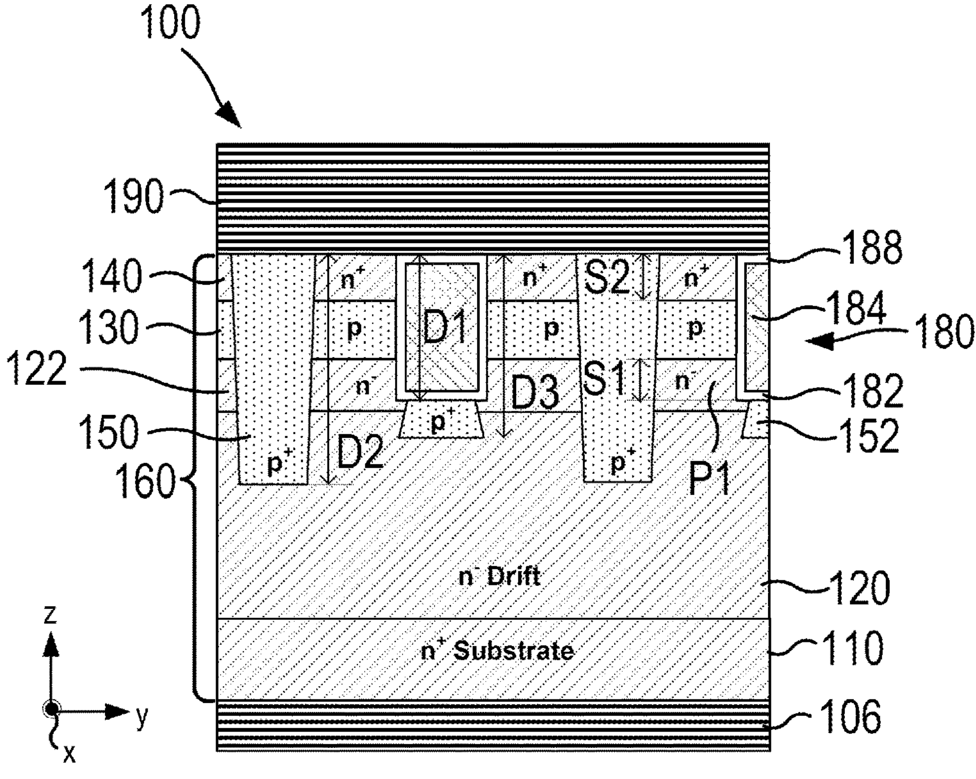
FIG. 3C is a schematic cross-sectional view of the gate trench silicon carbide power MOSFET of FIGS. 3A-3B that is taken along line 3C-3C of FIG. 3A.
Figure 3B:
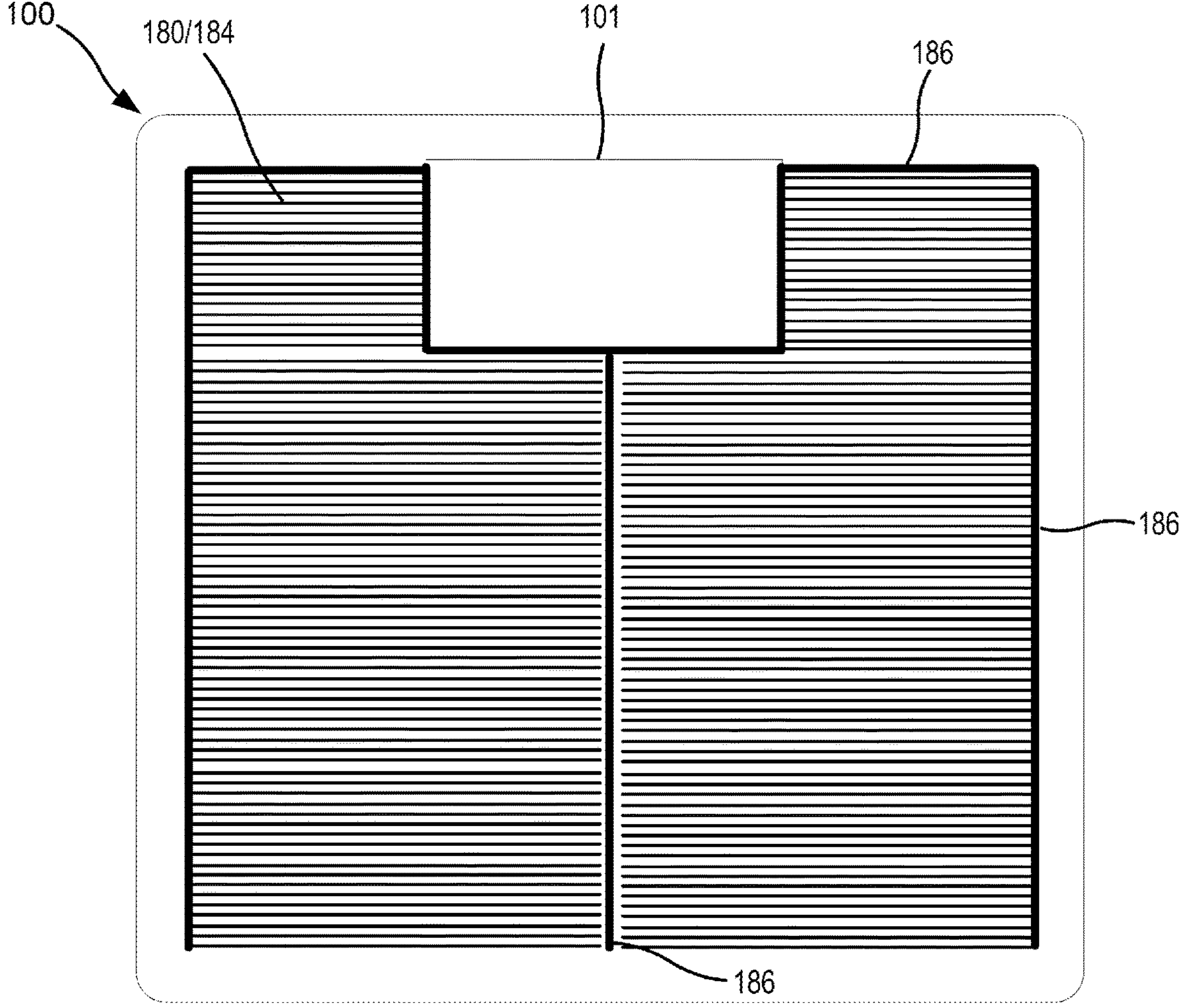
FIG. 3B is a schematic top view of the gate trench silicon carbide power MOSFET of FIG. 3A with various of the upper metal and dielectric layers removed.

FIG. 3A is a schematic top view of a gate trench silicon carbide power MOSFET 100 according to certain embodiments of the present invention. FIG. 3B is a schematic plan view of the power MOSFET 100 with various top-side metal and dielectric layers thereof omitted to show the gate electrodes and gate buses. FIG. 3C is a schematic cross-sectional view of a unit cell of the gate trench silicon carbide power MOSFET 100 that is taken along line 3C-3C of FIG. 3A. It will be appreciated that the thicknesses of various of the layers and regions in FIGS. 3A-3C are not necessarily drawn to scale. The same is true with respect to the other figures included in this application.

The power MOSFET 100 includes a semiconductor layer structure 160 (see FIG. 3C) that comprises one or more semiconductor substrates and/or layers. At least one of the semiconductor layers in the semiconductor layer structure 160 may be a silicon carbide layer. Various metal and/or dielectric layers are formed on either side of the semiconductor layer structure 160 and embedded in the semiconductor layer structure 160.

As shown in FIG. 3A, the top-side metal layers include a gate bond pad 102 and one or more source bond pads 104-1, 104-2 that are formed on the upper side of the semiconductor layer structure 160. A metal drain pad 106 (shown as a dotted box in FIG. 3A) is provided on the bottom side of the semiconductor layer structure 160. The gate bond pad 102, the source bond pads 104 and the drain pad 106 form the respective gate, source and drain terminals of power MOSFET 100. The gate and source pads 102, 104 may each be formed of a metal, such as aluminum, that bond wires can be readily attached to via conventional techniques such as thermo-compression or soldering. The drain pad 106 may likewise be a metal pad. A protective layer 109 such as a polyimide layer may cover the entire upper surface of power MOSFET 100 except for the gate and source pads 102, 104.

Still referring to FIG. 3A, the power MOSFET 100 includes a source metallization layer 190 (indicated by the dashed boxes in FIG. 3A) that electrically connects certain regions of the semiconductor layer structure 160 to the source bond pads 104-1, 104-2. The source bond pads 104-1, 104-2 may be portions of the source metallization layer 190 that are exposed through openings in the protective layer 109 or may be separate metal layers. The source metallization layer 190 may generally overlie or correspond to an “active region” 107 of the power MOSFET 100 where the unit cell transistors are located. An inactive region 108 of power MOSFET 100 surrounds the active region 107. The inactive region 108 may include a termination region that extends around the periphery of the MOSFET 100 that includes guard rings, junction termination elements or other termination structures (not shown), a gate pad region that underlies the gate pad 102, and gate bus regions (discussed below).

Bond wires 103 are shown in FIG. 3A that may be used to connect the gate bond pad 102 and the source bond pads 104 to external circuits or the like. The drain pad 106 on the bottom side of power MOSFET 100 may be connected to an external circuit through, for example, an underlying submount (not shown).

FIG. 3B is another plan view of power MOSFET 100 with the gate and source bond pads 102, 104, the polymide layer 109, the source metallization layer 190, the intermetal dielectric layers 188 and various other metal and dielectric layers removed to show the gate electrodes 184 that are formed in the gate trenches 180 in the semiconductor layer structure 160. A patterned field oxide layer (not shown) is formed on the semiconductor layer structure 160 in the inactive region 108 of the MOSFET 100. The field oxide layer may be a relatively thick oxide layer (e.g., ten to twenty times thicker than the gate oxide layers that are discussed below). A polysilicon layer 101 may be formed on the field oxide layer and may be formed in the region where the gate bond pad 102 is formed so that the gate bond pad 102 vertically overlaps the field oxide layer and the polysilicon layer 101. As used herein, two elements of a semiconductor device are considered to “vertically overlap” if an axis that is perpendicular to the major surfaces of a semiconductor layer structure of the semiconductor device intersects both elements.

One or more gate buses 186 are provided that extend around the periphery of the active region 107. The field oxide layer typically runs underneath each gate bus 186 as well as underlying the gate bond pad 102. The gate buses 186 are electrically connected to the gate bond pad 102, often through gate resistors (not shown). A plurality of gate trenches 180 (see FIG. 3C) are formed throughout the active region 107. A gate electrode 184 is formed in each gate trench 180. In the depicted MOSFET 100, the gate electrodes 184 extend horizontally across the semiconductor layer structure 160. In other cases, the gate electrodes 184 may extend vertically across the semiconductor layer structure 160, both horizontally-extending and vertically-extending gate electrodes 184 can be provided to form a grid-like gate electrode structure. The gate electrodes 184 may be connected to the gate pad 102 through the gate buses 186. The gate electrodes 184 may comprise, for example, a doped polysilicon pattern. The gate buses 186 may comprise polysilicon and/or metal structures in example embodiments and typically are in the inactive region 108 of power MOSFET 100.

FIG. 3C is a schematic cross-sectional view taken along line 3C-3C of FIG. 3A that illustrates about one and a half unit cells of the power MOSFET 100. As shown in FIG. 3C, the power MOSFET 100 includes an n-type silicon carbide semiconductor substrate 110. The substrate 110 may comprise, for example, a single crystal 4H silicon carbide semiconductor substrate that is heavily-doped with n-type impurities (i.e., an n+ silicon carbide substrate). The impurities may comprise, for example, nitrogen or phosphorous. In example embodiments, the n-type substrate 110 may have a doping concentration of, for example, between $1\times10^{18}$ atoms/$cm^3$ and $1\times10^{21}$ atoms/$cm^3$, although other doping concentrations may be used. The substrate 110 may be relatively thick in some embodiments (e.g., 20-100 microns or more). It should be noted that while the substrate 110 is depicted as a relatively thin layer, this is done to allow enlarging the thickness of other layers and regions in FIG. 3C, and it will be appreciated that the substrate 110 will typically be much thicker than shown. The thickness of various other layers of power MOSFET 100 likewise may not be shown to scale in order to allow other portions of the devices to be enlarged in the figures.

A lightly-doped n-type (n−) silicon carbide drift layer 120 (which also may be referred to herein as a drift region 120) is provided on an upper surface of the substrate 110. Typically, the drift layer 120 is formed via an epitaxial growth process and is doped during growth. The n-type drift region 120 may have, for example, a doping concentration of $5\times10^{15}$ to $5\times10^{17}$ dopants/$cm^3$. The n-type drift region 120 may be a thick region, having a vertical height above the substrate 110 of, for example, 3-50 microns, and can be doped during growth. An upper portion of the n-type drift region 120 may comprise an n-type JFET region 122 that is more heavily doped than the lower portion of the n-type drift region 120. The n-type JFET region 122 may have an n-type dopant concentration of, for example, $5\times10^{16}$ to $1\times10^{18}$. The n-type JFET region 122 is considered to be part of the drift region 120.

The drift layer 120 and the substrate 110 together act as a common drain region for the power MOSFET 100. The drain pad 106 is formed on the substrate 110 opposite the drift region 120.

Still referring to FIG. 3C, a moderately-doped (p) p-type silicon carbide well layer 130 is formed on the upper surface of the n-type JFET region 122 or in an upper portion of the n-type drift region 120 (i.e., the upper portion of the n-type drift region 120 is converted into the well layer 130). The moderately-doped (p) p-type silicon carbide well layer 130 may be formed either by epitaxial growth or by implanting p-type dopant ions into the upper portion of the n-type drift region 120 to convert the upper portion of the n-type drift layer 120 into the p-type silicon carbide well layer 130. In example embodiments, the moderately-doped p-type well layer 130 may have a p-type dopant concentration of, for example, between $5\times10^{16}$ to $1\times10^{18}$.

A heavily-doped (n+) n-type silicon carbide source layer 140 is formed on the p-type silicon carbide well layer 130. The heavily-doped n-type silicon carbide source layer 140 may be formed by ion implantation. The heavily-doped n-type silicon carbide source layer 140 may have a doping concentration of, for example, between $1\times10^{19}$ atoms/cm$^3$ and $5\times10^{21}$ atoms/cm$^3$.

As is further shown in FIG. 3C, p-type support shields 150 are provided that extend downwardly from the upper portion (e.g., the upper surface) of the semiconductor layer structure 160 into the silicon carbide drift region 120. The p-type support shields 150 may be moderately or heavily doped ($p^+$) silicon carbide regions. For example, each p-type support shield 150 may have a doping concentration between about $5\times10^{16}$ and $1\times10^{22}$. In other embodiments, each p-type support shield 150 may have a doping concentration between about $1\times10^{18}$ and $1\times10^{20}$, between about $1\times10^{19}$ and $1\times10^{20}$, between about $1\times10^{17}$ and $1\times10^{19}$, between about $1\times10^{17}$ and $1\times10^{20}$, or between about $1\times10^{18}$ and $1\times10^{21}$. The p-type support shields 150 may have a doping concentration that is graded with depth. In example embodiments, each p-type support shield 150 may extend to a depth of between 0.1 microns and 4.0 microns from the upper surface of the semiconductor layer structure 160. In other embodiments, the depth of each p-type support shield 150 may be between 1.0 and 3.0 microns, between 1.0 and 2.5 microns, between 1.5 and 3.0 microns, between 1.5 and 2.5 microns, or between 0.5 and 2.5 microns. Any of the above dopant concentration ranges for the p-type support shields 150 may be matched with any of the above-listed depths for the p-type support shields 150. The p-type support shields 150 may act to reduce the electric field levels that form in gate oxide layers (discussed below) during device reverse blocking operation, as will be discussed in greater detail below.

As discussed above, a plurality of gate trenches 180 are formed in the upper surface of the semiconductor layer structure 160. P-type trench shielding regions 152 are formed underneath the respective gate trenches 180 and may extend underneath the respective gate trenches 180 for all or substantially all of the length of the gate trench 180. The p-type trench shielding regions 152 may be moderately or heavily doped ($p^+$) silicon carbide regions. For example, each p-type trench shielding region 152 may have a doping concentration between about $1\times10^{17}$ and $1\times10^{21}$. In other embodiments, each p-type trench shielding region 152 may have a doping concentration between about $1\times10^{18}$ and $1\times10^{20}$, between about $1\times10^{19}$ and $1\times10^{20}$, between about $1\times10^{17}$ and $1\times10^{20}$, or between about $1\times10^{18}$ and $1\times10^{21}$. In example embodiments, each p-type trench shielding region 152 may extend to a depth of between 0.5 and 3.0 microns from the upper surface of the semiconductor layer structure 160. In other embodiments, the depth of each p-type trench shielding region 152 may be between 1.0 and 3.0 microns, between 1.0 and 2.5 microns, between 1.5 and 3.0 microns, between 1.5 and 2.5 microns, or between 0.5 and 2.5 microns. Any of the above dopant concentrations may be matched with any of the above-listed depths for the p-type trench shielding regions 152. The p-type trench shielding regions 152 may act to reduce the electric field levels that form in gate oxide layers (discussed below) during device operation, as will be discussed in greater detail below. The p-type trench shielding regions 152 may be doped to have a higher p-type dopant concentration, a lower p-type dopant concentration, or approximately the same p-type dopant concentration as the p-type support shields 150.

While not shown in FIG. 3C, electrical connections are provided, in and/or outside of the active region 107, that electrically connect the p-type trench shielding regions 152 to the p-type silicon carbide well layer 130. U.S. Pat. Nos. 9,887,287 and 11,610,991 each illustrate designs for metal or p-type silicon carbide trench shield connection patterns that can be used to electrically connect p-type trench shielding regions to a p-type silicon carbide well layer. Any of the p-type silicon carbide trench shield connection patterns disclosed in these patents (each of which is incorporated herein by reference) can be used to electrically connect the p-type trench shielding regions 152 to the p-type silicon carbide well layer 130. Additionally or alternatively, the p-type trench shielding regions 152 may be directly connected to the source metallization layer 190 through p-type silicon carbide trench shield connection patterns that, for example, are formed in the gate trenches 180, as shown in U.S. Patent Publication No. 2022/0130998, the entire content of which is also incorporated herein by reference in its entirety.

The n-type silicon carbide substrate 110, the n-type silicon carbide drift layer 120 (including the JFET region 122), the p-type silicon carbide well layer 130, the n-type silicon carbide source regions 140, the p-type silicon carbide support shields 150 and the p-type silicon carbide trench shielding regions 152 may together comprise the semiconductor layer structure 160 of the power MOSFET 100.

As noted above, a plurality of gate trenches 180 are formed in the upper portion of the semiconductor layer structure 160. While only one full gate trench 180 and a portion of a second gate trench 180 are shown in the cross-section of FIG. 3C, it will be appreciated from FIG. 3B that the MOSFET 100 may include a large number of gate trenches 180. Each gate trench 180 may extend along a longitudinal axis through the semiconductor layer structure 160, and the gate trenches 180 may extend in parallel to each other as shown best in FIG. 3B. It will be appreciated that the longitudinal axes of the gate trenches 180 extend into the page in the view of FIG. 3C. The gate trenches 180 may be formed via an etching process.

A gate oxide layer 182 is provided in each gate trench 180 to cover the sidewalls and bottom surface of the gate trench 180. In some embodiments, each gate oxide layer 182 may extend onto the upper surface of the semiconductor layer structure 160. Each gate oxide layer 182 may comprise, for example, a silicon oxide ($SiO_2$) pattern. The gate oxide layers 182 may or may not be connected to each other outside the view of FIG. 3C. The gate oxide layers 182 may be formed generally conformally within the respective gate trenches 180.

A gate electrode 184 is formed in each gate trench 180 on the gate oxide layer 182. The gate electrodes 184 may comprise conductive material such as a silicide (e.g., NiSi, TiSi, WSi, CoSi), doped polycrystalline silicon (poly-Si), and/or a stable conductor. Other suitable materials for the gate electrode include various metals such as Ti, Ta or W or metal nitrides such as TiN, TaN or WN. The gate oxide layers 182 may insulate the gate electrodes 184 from the semiconductor layer structure 160, thereby preventing the gate electrodes 184 from short circuiting to the semiconductor layer structure 160. Each gate electrode 184 may connect to one of the gate buses 186 (see FIG. 3B). In the depicted embodiment, the gate electrodes 184 are recessed so that the upper surface of each gate electrode 184 is below an upper surface of the semiconductor layer structure 160. It will be appreciated that in other embodiments the gate electrodes 184 may extend above and onto the upper surface of the semiconductor layer structure 160, with the gate oxide layer 182 insulating the gate electrodes 184 from the upper surface of the semiconductor layer structure 160.

Intermetal dielectric layers 188 are formed that cover each gate electrode 184. The intermetal dielectric layers 188 insulate the source metallization layer 190 from the gate electrodes 184.

A source metallization layer 190 is formed on the upper surface of the semiconductor layer structure 160 and on the intermetal dielectric layers 188. Herein, the source metallization layer 190 may also be referred to as the "source contact." The source metallization layer 190 may comprise a single metal layer or multiple metal layers. Typically multiple metal layers are provided, as the source metallization layer 190 may include a single layer or multi-layer adhesion layer that contacts the semiconductor layer structure 160, one or more barrier layers, and a bulk metal layer (e.g., an aluminum layer).

The p-type support shields 150 may be formed by ion implantation. When standard (random) ion implantation techniques are used, dopant ions are implanted at high energy into an upper surface of a semiconductor body. As the dopant ions pass into the semiconductor material, they collide with atoms in the crystal lattice, which causes the dopants ions to lose energy and which may also redirect the dopant ions in different directions. Most typically, the dopant ions are implanted at an angle of 90° with respect to the upper surface of the semiconductor body (i.e., vertically). As the dopant ions collide with atoms in the crystal lattice, they will be redirected so that they move both laterally and vertically through the crystal lattice. This lateral movement results in the implanted region spreading out laterally (the "blooming" phenomena discussed above), and the amount of lateral spread tends to increase with increasing depth into the semiconductor body. This can be seen in the cross-section of FIG. 2, where the sidewalls of the support shields 50 angle outwardly with increasing depth in the semiconductor layer structure 60. As discussed above, this phenomena acts to reduce the JFET gap 24, which may increase the on-state resistance of MOSFET 1.

In contrast, the support shields 150 of MOSFET 100 have sidewalls that angle inwardly with increasing depth into the semiconductor layer structure 160, and thus the cross-sectional area of each support shield 150 (taken along horizontal cross-sections of the support shield 150) decreases as the support shield extends farther into (from the upper surface) of the semiconductor layer structure 160. As a result, the JFET gap 124 is at its narrowest at the upper surface of the JFET region 122. This may act to lower the on-state resistance. As will be discussed below, one technique that can be used to form support shields 150 having the shapes shown in FIG. 3C is to perform a channeled ion implantation using an ion implantation mask having angled sidewalls during the channeled ion implantation process.

The power MOSFET 100 may be turned on by applying a gate bias voltage that is above a threshold level to the gate pad 102. The gate bias voltage is transferred to the gate electrodes 184 via the gate buses 186 and creates conductive n-type inversion layers in the portions of the p-type silicon carbide well layer 130 that are adjacent the gate trenches 180. These regions of the p-type silicon carbide well layer 130 are referred to herein as channel regions as current flows from the source layer 140 to the drift region 120 through these channel regions during on-state operation. The channel regions are vertically oriented (i.e., extend in the z direction) as the current flows downwardly from the source layer 140, through the channel regions to the drift region 120, substrate 110 and drain contact 106.

As discussed above, one common failure mechanism in power semiconductor devices such as power MOSFETs is device failure due to breakdown of the gate oxide layer. Since the lifetime (i.e., time until breakdown) of a gate oxide layer is a function of the intensity of the electric field in the gate oxide layer during device operation, one way to reduce the instances of device failure is to design the MOSFET to have reduced peak electric field values in the gate oxide layer during reverse blocking operation.

During reverse blocking operation, the electric field extends upwardly from the bottom of the MOSFET 100. As such, strong electric fields may extend upwardly toward the lower portion of the gate oxide layers 182. The p-type silicon carbide trench shielding regions 152 act as a shield that reduces the electric field values directly underneath the gate trenches 180. The electric field, however, will tend to extend upwardly on both sides of each trench shielding region 152. As such, the electric field tends to be highest in the portions of the gate oxide layers 182 that are not directly protected by the trench shielding regions 152, such as the lower sidewalls and lower corners of each gate oxide layers 182. Moreover, electric field crowding effects occur in the lower corners of each gate oxide layer 182, further increasing the intensity of the electric field in these portions of the gate oxide layers 182. Thus, while the trench shielding regions 152 help reduce the electric field levels in the gate oxide layers 182, the lower corners of the gate oxide layers 182 are typically only partially protected, and these lower corners are the portions of the gate oxide layers 182 that are most susceptible to breakdown due to the electric field crowding effects.

The support shields 150, like the trench shielding regions 152, suppress the extent to which the electric field extends upwardly from the drain pad 106. The minimum JFET gap 124 may be set by the on-state resistance requirements for the MOSFET 100. This parameter directly effects the integration level of MOSFET 100, as the larger the minimum JFET gap 124, the larger the size of each unit cell of MOSFET 100. Since the support shields 150 become smaller with increasing depth, they allow for increased integration, which reduces fabrication costs and the size of the MOSFET 100.

Still referring to FIG. 3C, it can be seen that MOSFET 100 includes a silicon carbide based semiconductor layer structure 160 that comprises, among other things, a drift region 120 having a first (n) conductivity type, a well layer 130 having a second (p) conductivity type on an upper surface of the drift region 120, and a support shield 150 having the second (p) conductivity type. A first gate trench 180 extends into (i.e., is formed in) an upper portion of the semiconductor layer structure 160. A second gate trench 180 also extends into the upper portion of the semiconductor layer structure 160, and the support shield 150 may be in between the first and second gate trenches 180. As shown in FIG. 3C, the support shield 150 includes a first segment S1 that is deeper in the semiconductor layer structure 160 than the well layer 130 (i.e., is below the well layer 130 in the view of FIG. 3C) and that is less deep in the semiconductor layer structure 160 than a bottom of the first gate trench 180. A lateral width of the first segment S1 of the support shield 150 decreases with increasing distance from the well layer 130. Consequently, as shown in FIG. 3C, the sidewalls of the first segment S1 of the support shield 150 angle inwardly with increasing depth into the semiconductor layer structure 160. It will be appreciated that, as used herein, references to the "depth" of structures or elements within a semiconductor layer structure refer to the distance that those structures or elements are from the upper surface of the semiconductor layer structure, where the upper surface of the semiconductor layer structure is the surface opposite the substrate and is also the surface in which the gate trenches are formed.

As shown in FIG. 3C, in some embodiments the entire portion of the support shield 150 that extends below the well layer 130 may have a lateral width that decreases with increasing distance from the well layer 130 (i.e., with increasing depth into the semiconductor layer structure 160). As shown, in some embodiments, the entirety of the support shield 150 may have a lateral width that decreases with increasing distance from the upper surface of the semiconductor layer structure 160.

As is also shown in FIG. 3C, the bottom of the first gate trench 180 is at a first depth D1 from the upper surface of the semiconductor layer structure 160 and a bottom of the support shield 150 is at a second depth D2 from the upper surface of the semiconductor layer structure 160, where the second depth D2 is greater than the first depth D1. The trench shielding region 152, which has the second (p) conductivity type, is provided below the first gate trench 180. A bottom of the trench shielding region 152 has a third depth D3 from the upper surface of the semiconductor layer structure 160. The second depth D2 may also be greater than the third depth D3.

As described above, the MOSFET 100 may further include a source layer 140 having the first (n) conductivity type in the semiconductor layer structure 160 on the well layer 130, and a gate oxide layer 182 and a gate electrode 184 that are in the first gate trench 180. Because the sidewalls of the support shield 150 angle inwardly with increasing depth into the semiconductor layer structure 160, a maximum width of a second segment S2 of the support shield 150 that horizontally overlaps the source layer 140 is larger than a width of the support shield 150 at the point where the support shield 150 horizontally overlaps the bottom of the first gate trench 180 (i.e., the portion of the support shield 150 that has the same depth as the first gate trench 180, which is the bottom of the first segment S1 of the support shield 150). In some embodiments, the maximum width of the second segment S2 of the support shield 150 may be at least 1-50% larger than the width of the support shield at the point where the support shield 150 horizontally overlaps the bottom of the first gate trench 180. In other embodiments, the maximum width of the second segment S2 of the support shield 150 may be at least 2-40% larger, 2-20% larger, 5-40% larger, or 5-25% larger, than the width of the support shield at the point where the support shield 150 horizontally overlaps the bottom of the first gate trench 180.

The MOSFET 100 may further include a JFET region 122 which may comprise at least part of an upper region of the drift region 120. The JFET region 122 may have a higher first conductivity type doping concentration than the drift region 120. The well layer 130 may be on an upper surface of the JFET region 122. As shown in FIG. 3C, a first portion P1 of the JFET region 122 that is in between the first gate trench 180 and the support shield 150 has a lateral width that increases with increasing distance from the well layer 130 since the sidewall of the first segment S1 of the support shield 150 (which horizontally overlaps the first portion P1 of the JFET region 122) has a sidewall that is angled inwardly.

FIGS. 4A-4*e* are schematic cross-sectional views illustrating a method of fabricating the gate trench silicon carbide power MOSFET 100 of FIGS. 3A-3C.

Figure 4A:
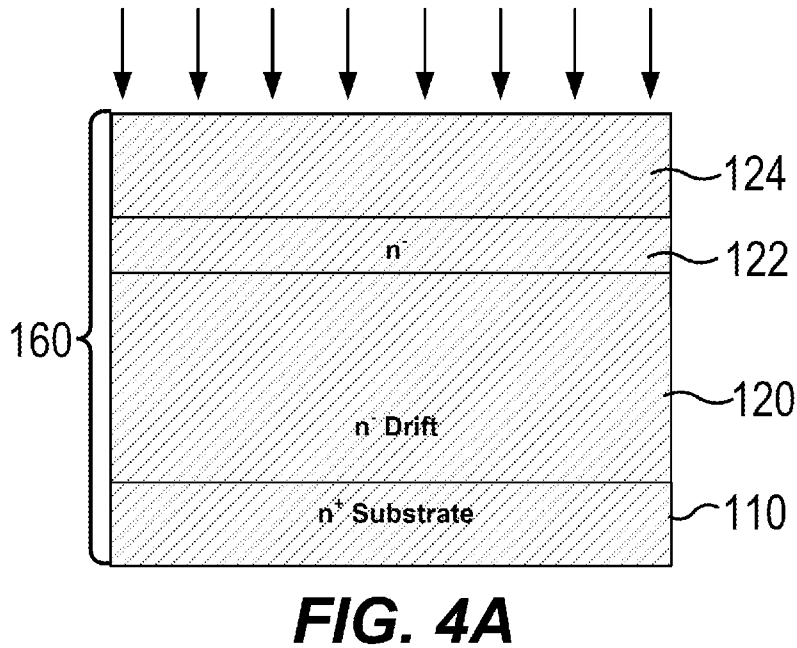
FIGS. 4A-4E are schematic cross-sectional views illustrating a method of fabricating the gate trench silicon carbide power MOSFET of FIGS. 3A-3C.

Referring to FIG. 4A, the n-type silicon carbide substrate 110 is provided. The lightly-doped (n) silicon carbide drift layer 120 is then formed on an upper surface of the substrate 110, typically via epitaxial growth. The n-type dopant concentration may be increased during the growth of the upper portion of the drift layer 120 to form the JFET region 122 in the upper portion of the drift layer 120. The epitaxial growth process may then continue (with the n-type dopant source left turned on or turned off) to grow a region 124 on the upper surface of the JFET region 122. The region 124 will be converted into the p-type well layer 130 and the n-type source layer 140 in later processing steps.

Figure 4B:
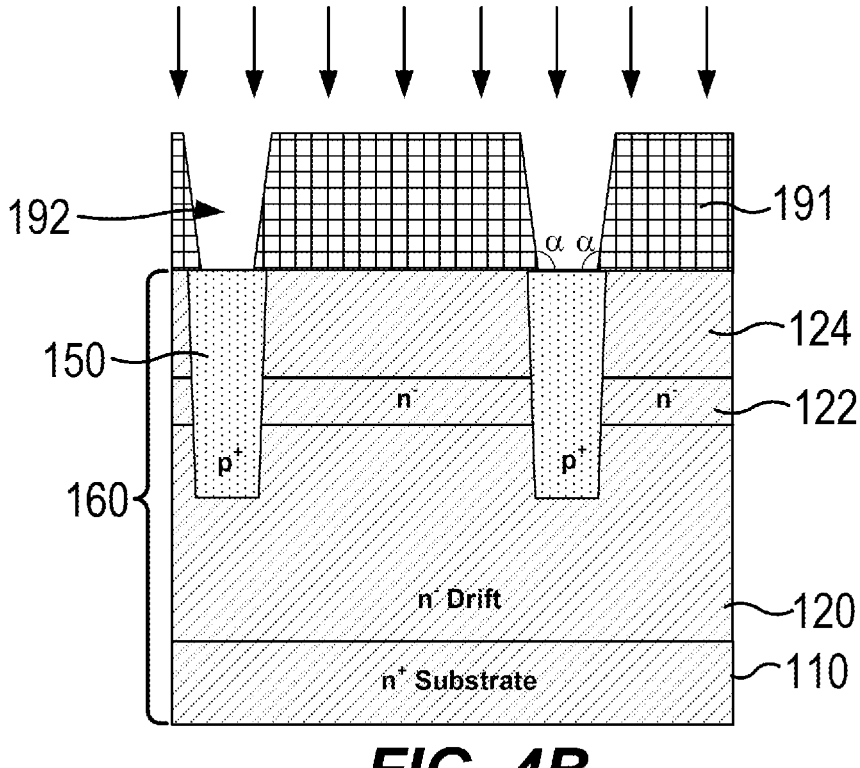

Referring to FIG. 4B, a first mask layer such as, for example, an oxide mask layer is formed on the upper surface of the semiconductor layer structure 160. The first mask layer is then patterned to form openings 192 therein to provide a first patterned mask 191 that expose selected portions of the semiconductor layer structure 160. The openings 192 may be centered above locations in the semiconductor layer structure 160 in which the support shields 150 will be formed, but the openings 192 may be narrower than the intended width of the top portion of each support shield 150. Notably, the sidewalls of the mask sections on either sides of the openings 192 are angled outwardly so that the width of these mask sections increases as it comes closer to the semiconductor layer structure 160. As such, the sidewalls of the mask 191 that define each opening 192 are angled sidewalls that each defines an obtuse angle $\alpha$ with respect to the upper surface of the semiconductor layer structure 160 that is exposed through the respective opening 192, as shown in FIG. 4B. In some embodiments, the obtuse angle $\alpha$ is an angle between 100° and 160°. A thickness of the first patterned mask 191 is sufficient so that few or no dopant ions are able to pass through the full thickness of the first patterned mask 191 to implant into the semiconductor layer structure 160. The angled sidewalls that define the openings 192 may be formed using various known etching techniques.

Still referring to FIG. 4B, a channeled ion implantation process is performed to implant p-type dopant ions into the semiconductor layer structure 160 to form the p-type support shields 150. As discussed in U.S. Pat. No. 11,075,264 ("the '264 publication"), the entire content of which is incorporated herein by reference, a channeled ion implantation process refers to ion implantation process where the dopant ions are implanted along certain crystallographic axes in silicon carbide where channels are provided where no atoms are present. Channeled ion implantation may be performed by angling the ion source with respect to the semiconductor layer structure so that the dopant ions are implanted along a desired crystallographic axis, as explained in further detail in the '264 publication. When dopant ions are implanted along channels in the crystallographic axis, the dopant ions travel, on average, much farther through the crystal lattice before they strike atoms within the crystal lattice than is the case when a standard (random) ion implantation process is performed. Consequently, the ions implanted in a channeled ion implantation process can be, on average, implanted to deeper depths while using lower implantation energies (which advantageously reduces damage to the silicon carbide from the implantation and which also reduces scattering of the dopant ions to unintended locations in the crystal lattice). In addition, channeled ion implantation typically results in little or no blooming of the implanted region with depth since the dopant ions end up striking fewer atoms and/or are more constrained within the channels.

As noted above, the thickness of the first patterned mask 191 is selected so that dopant ions generally are not able to pass through the full thickness of the mask 191. However, since the sidewalls that define the openings 192 in the first patterned mask 191 are angled sidewalls, dopant ions that strike the sidewalls will not need to travel through the full thickness of the mask 191 to reach the semiconductor layer structure 160. As such, some of the dopant ions that are implanted into the angled sidewalls of the first patterned mask 191 will travel through the mask 191 and be implanted into the semiconductor layer structure 160. Passing through the mask 191, however, reduces the energy of these dopant ions (as they strike atoms within the mask 191), and hence dopant ions that pass through the mask 191 before implanting into the semiconductor layer structure 160 will not, on average, travel as far (deep) into the semiconductor layer structure 160 as dopant ions that are implanted through the openings 192 directly into the semiconductor layer structure 160. Moreover, the farther up one of the sidewalls a dopant ion is injected (i.e., the farther away from the bottoms of the openings 192), the less deep, on average, the dopant ions will implant into the semiconductor layer structure 160. As a result, the support shields 150 may be widest at the top and then narrow in width as they extend further into the semiconductor layer structure 160, as shown in FIG. 4B. In other words, the widths of the respective support shields 150 decrease with increasing distance from an upper surface of the semiconductor layer structure 160.

Support shields 150 having the shape shown in FIG. 4B may be advantageous for at least two reasons. First, since the support shields 150 are widest at the top, they have an expanded area for contacting the source metallization layer 190. This may provide a lower resistance connection between the source metallization layer 190 and the support shields 150 and p-well layer 130, which may improve device performance. Second, as discussed above, the narrowing of the bottom portion of each support shield 150 acts to increase the JFET gaps 124, which may lower the on-state resistance of MOSFET 100 or allow the unit cells thereof to be spaced more closely together by reducing the distance between adjacent gate trenches 180.

While the above description of FIG. 4B indicates that a channeled ion implantation is used to form the support shields 150, it will be appreciated that embodiments of the present invention are not limited thereto. For example, in other embodiments, a standard (random) ion implantation process may be used instead. However, due to the blooming that occurs with such an implantation process, it may be difficult to obtain support shields that have sidewalls that angle inwardly even when the ion implantation mask has openings with angled sidewalls.

Figure 4C:
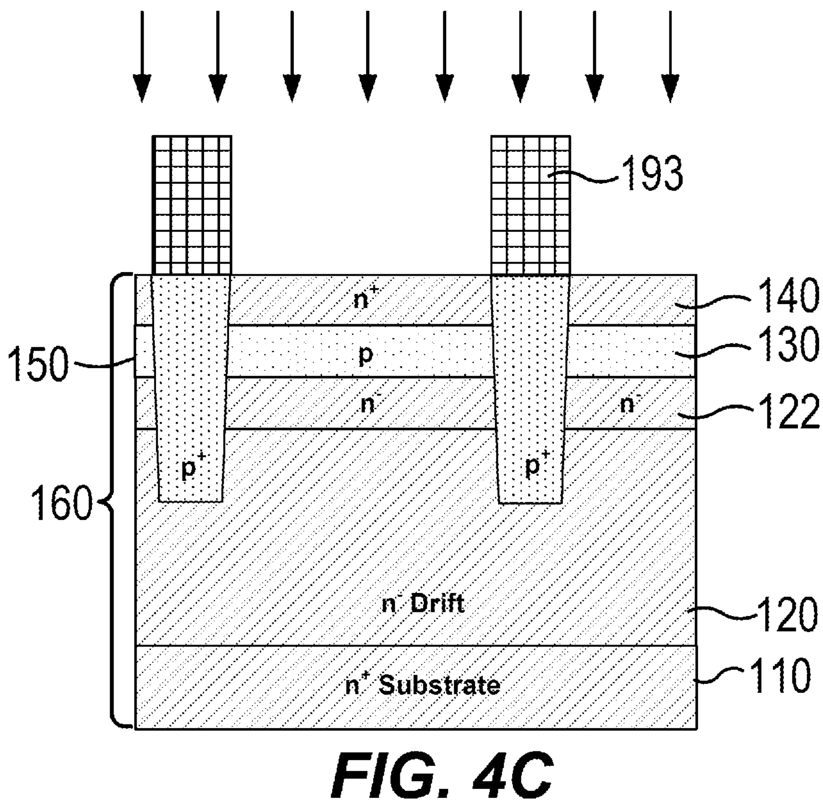

Referring to FIG. 4C, a second mask layer is formed on the upper surface of the semiconductor layer structure 160 and patterned to form a second ion implantation mask 193. A second ion implantation process is performed to implant p-type ions into the upper portion of the semiconductor layer structure 160. The second ion implantation process may be a buried process that primarily implants the p-type ions into the portion of region 124 that is immediately above the JFET region 122 to form the p-type well layer 130. Then, a third, shallower, ion implantation process is performed to implant n-type ions into the upper portion of the region 124 to form an n-type source layer 140 above the p-well layer 130. The second ion implantation mask 193 covers the support shields 150 during the second and third ion implantation processes. It will be appreciated that the second and third ion implantation steps may be performed in reverse order. It will also be appreciated that the p-type well layer 130 and/or the n-type source layer 140 may alternatively be formed by appropriately doping these regions during the epitaxial growth process discussed with respect to FIG. 4A above.

Figure 4D:
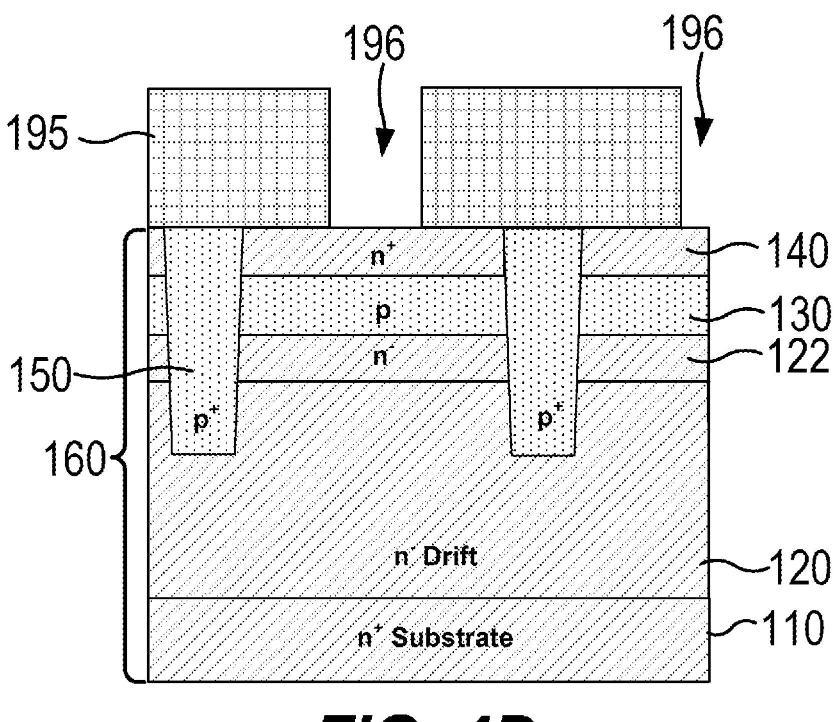

Referring to FIG. 4D, the second patterned mask 193 may be removed and a third mask layer (e.g., another oxide mask layer) may be formed to cover the semiconductor layer structure 160. The third mask layer may then be patterned (e.g., using standard photolithography patterning techniques) to form openings 196 therein that expose selected portions of the semiconductor layer structure 160 to provide a third patterned mask 195. The openings 196 may be positioned above locations in the semiconductor layer structure 160 in which the gate trenches 180 are formed in a subsequent processing step.

Figure 4E:
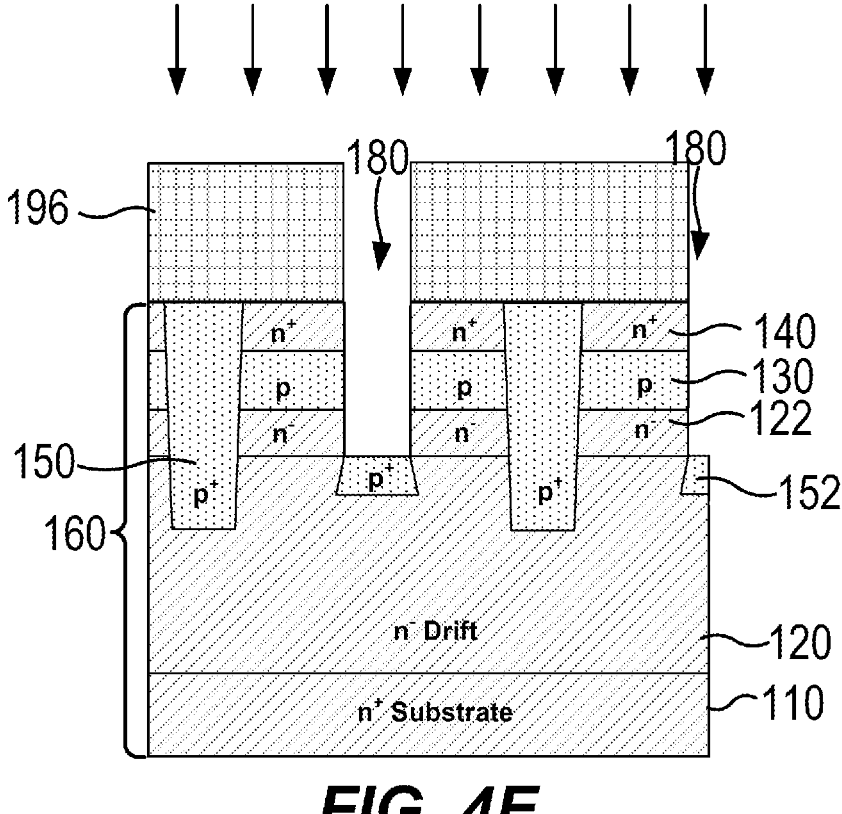

Referring to FIG. 4E, an etching process is performed to etch the exposed portions of the semiconductor layer structure 160 to form the gate trenches 180. As shown, in some embodiments the gate trenches 180 may not extend as deep into the semiconductor layer structure 160 as the bottoms of the support shields 150. Next, an ion implantation process is performed to implant p-type dopant ions into the portions of the semiconductor layer structure 160 that are underneath the gate trenches 180 to form the trench shielding patterns 152. As discussed above, the trench shielding patterns 152 may not extend as deeply into the semiconductor layer structure 160 as the support shields 150 in some embodiments.

Referring again to FIG. 3C, the gate oxide layers 182 and gate electrodes 184 may then be formed in the gate trenches 180, and the intermetal dielectric layers 188 are formed to cover the gate oxide layers 182 and gate electrodes 184. The source metallization layer 190 is then formed on the source regions 140, the intermetal dielectric layers 188 and support shields 150. The drain pad 106 is then formed on the bottom of the substrate 110.

Figure 5:
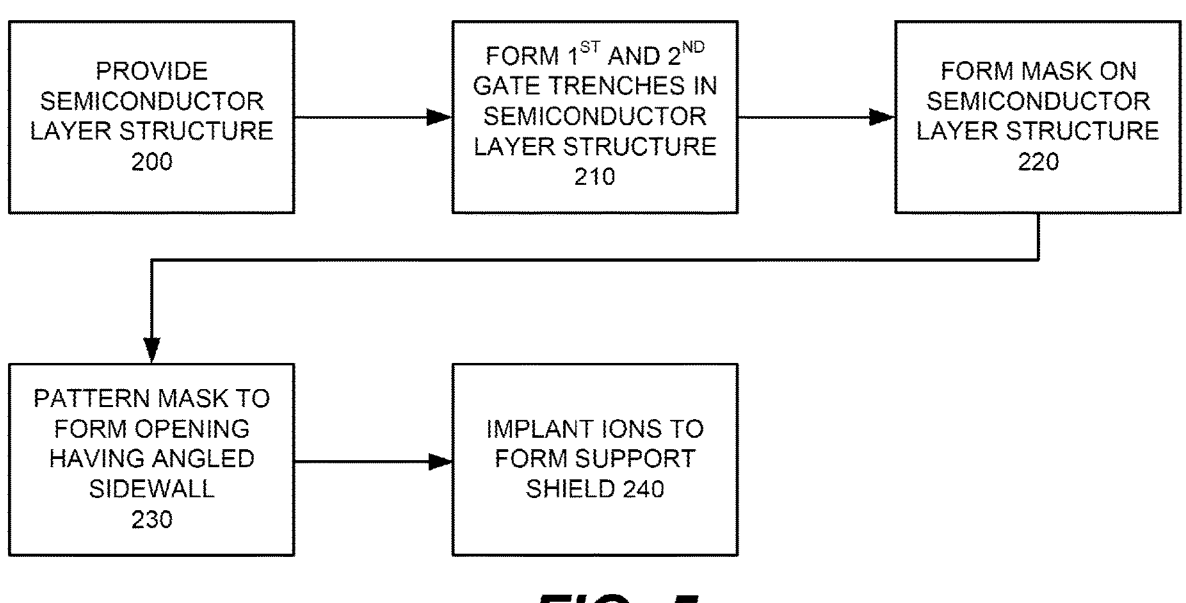
FIG. 5 is a flow chart illustrating a method of fabricating the gate trench silicon carbide power MOSFET of FIGS. 3A-3C.

FIG. 5 is a flow chart illustrating a method of forming the gate trench silicon carbide power MOSFET of FIGS. 3A-3C. As shown in FIG. 5, first a silicon carbide based semiconductor layer structure 160 is provided (Block 200). The semiconductor layer structure 160 includes a drift layer 120 having a first conductivity type.

Next, first and second gate trenches 180 are formed in the semiconductor layer structure 160 by, for example, forming an etch mask on the upper surface of the semiconductor layer structure 160, patterning the etch mask to expose selected regions of the semiconductor layer structure 160 where the gate trenches 180 will be formed, and then etching the exposed portions of the semiconductor layer structure 160 to form the first and second gate trenches 180 in the semiconductor layer structure 160 (Block 210). Each gate trench 180 may extend to a first depth D1 into an upper surface of the semiconductor layer structure 160.

Next, an ion implantation mask is formed on the upper surface of the semiconductor layer structure 160 (Block 220). The ion implantation mask is then patterned to an opening therein. The ion implantation mask is patterned in a manner so that at least one of the sidewalls of the patterned mask that define the opening has an angled sidewall (Block 230). The angled sidewall defines an obtuse angle α with respect to the upper surface of the semiconductor layer structure 160 that is exposed through the opening, as shown in FIG. 4B. In some embodiments, the obtuse angle α is an angle between 100° and 160°.

Then second conductivity type dopants are implanted into the upper surface of the semiconductor layer structure 160 to form a support shield 150 having the second conductivity type in the semiconductor layer structure 160 between the first and second gate trenches 180 (Block 240). The support shield trench 150 may extend to a second depth D2 into the upper surface of the semiconductor layer structure 160, where the second depth D2 is less than the first depth D1.

It will be appreciated that the processing steps discussed above with reference to FIGS. 4A-4E and 5 could be performed in different orders in further embodiments. As an example, in the flow chart of FIG. 5, the first and second gate trenches 180 are formed before the support shield 150 is formed. However, in the description of FIGS. 4A-4E above, the support shields 150 are formed before the gate trenches 180 are formed. Thus, it will be appreciated that various of the processing steps may be carried out in different orders than shown in FIG. 5 (or FIGS. 4A-4E). It will also be appreciated that some of the processing steps could be omitted in other embodiments, and/or that other processing steps may be added to the method.

FIGS. 6A-6E are schematic cross-sectional views of gate trench silicon carbide power MOSFETs 100A-100E, respectively, that are modified versions of the gate trench silicon carbide power MOSFET 100. Gate trench silicon carbide power MOSFETs 100A-100E are almost identical to MOSFET 100, so the discussion below will focus solely on the difference between each of MOSFETs 100A-100E and MOSFET 100.

Figure 6A:
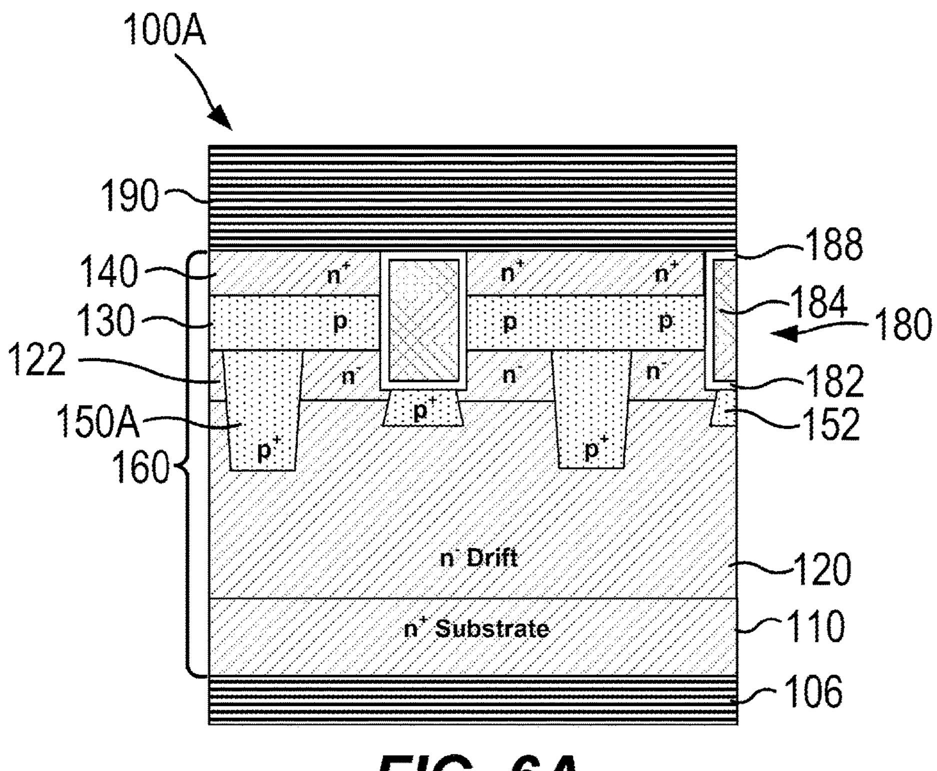
FIGS. 6A-6E are schematic cross-sectional views of modified versions of the gate trench silicon carbide power MOSFET of FIGS. 3A-3C where the cross-sections are taken along line 3C-3C of FIG. 3A.

As can be seen by comparing FIG. 3C and FIG. 6A, the only difference between MOSFET 100 and MOSFET 100A is that MOSFET 100A includes buried p-type support shields 150A that extend downwardly from the p-well layer 130 instead of extending downwardly from the upper surface of the semiconductor layer structure 160. In the embodiment of FIG. 6A a p-type semiconductor connection may be made between the source metallization layer 190 and the p-well layer 130 outside of the cross-sectional view. Otherwise, MOSFET 100A may be identical to MOSFET 100, so further description thereof will be omitted.

Figure 6B:
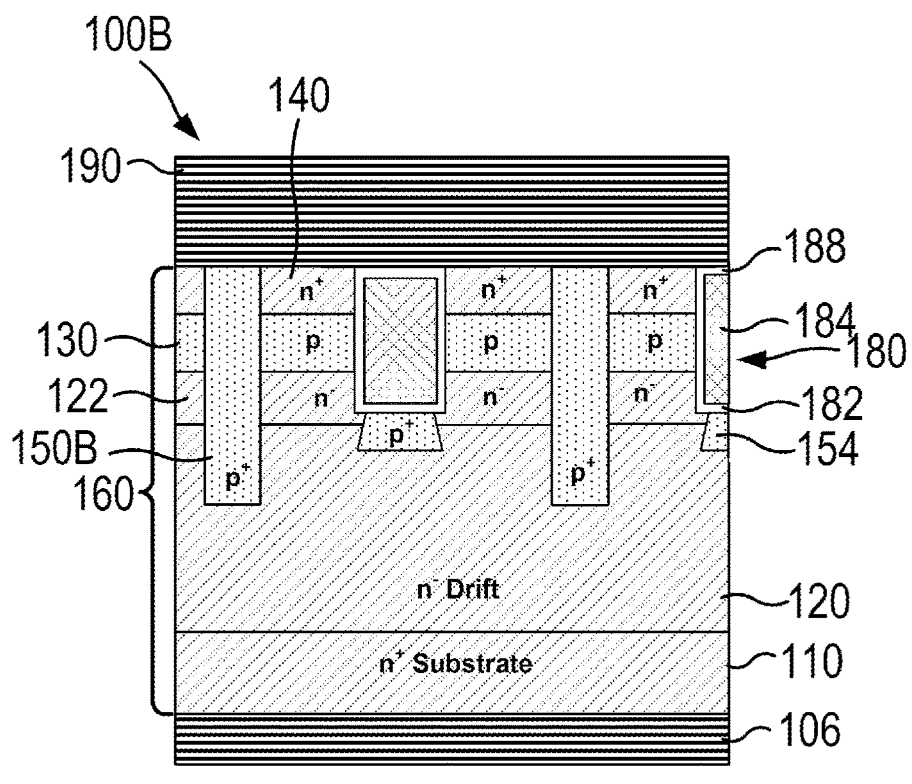

Referring to FIG. 6B, a MOSFET 100B is depicted that is similar to MOSFET 100 of FIGS. 3A-3C, but the support shields 150B0 included in MOSFET 100B are formed using a patterned ion implantation mask that has non-angled (straight) sidewalls and a channeled ion implantation process. As shown in FIG. 6B, the p-type support shields 150B in MOSFET 100B may have substantially vertical (non-angled) sidewalls since the channeled ion implantation may result in little or no blooming. Otherwise, MOSFET 100B may be identical to MOSFET 100, so further description thereof will be omitted.

Figure 6C:
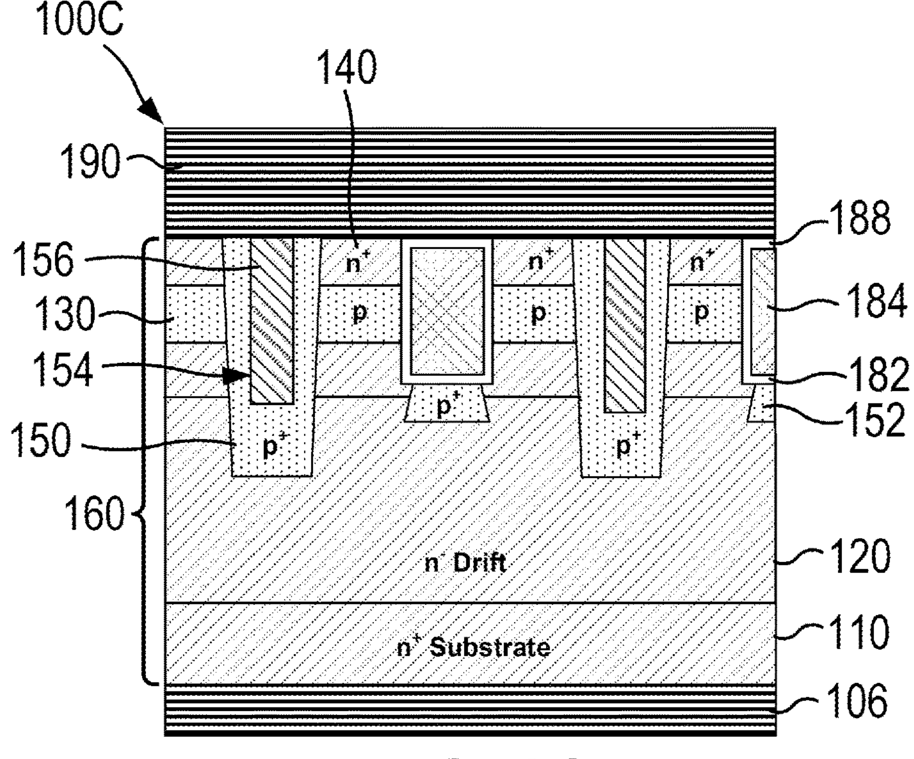

As can be seen by comparing FIG. 3C and FIG. 6C, the only difference between MOSFET 100 and MOSFET 100C is that MOSFET 100C includes support shield trenches 154 that are formed within the support shields 150. The support shield trenches 154 do not extend through bottom surfaces of the respective support shields 150. In other words, the support shield trenches 154 extend part of the way, but not completely through, the respective support shields 150. The support shield trenches 154 are filled with a conductive material 156 other than silicon carbide such as, for example, p-type polysilicon, nickel oxide or a metal that forms a Schottky contact with silicon carbide. The conductive materials 156 that fill the respective support shield trenches 154 form a low resistance contact to the support shields 150. Otherwise, MOSFET 100C may be identical to MOSFET 100, so further description thereof will be omitted.

Figures 6D, 6E:
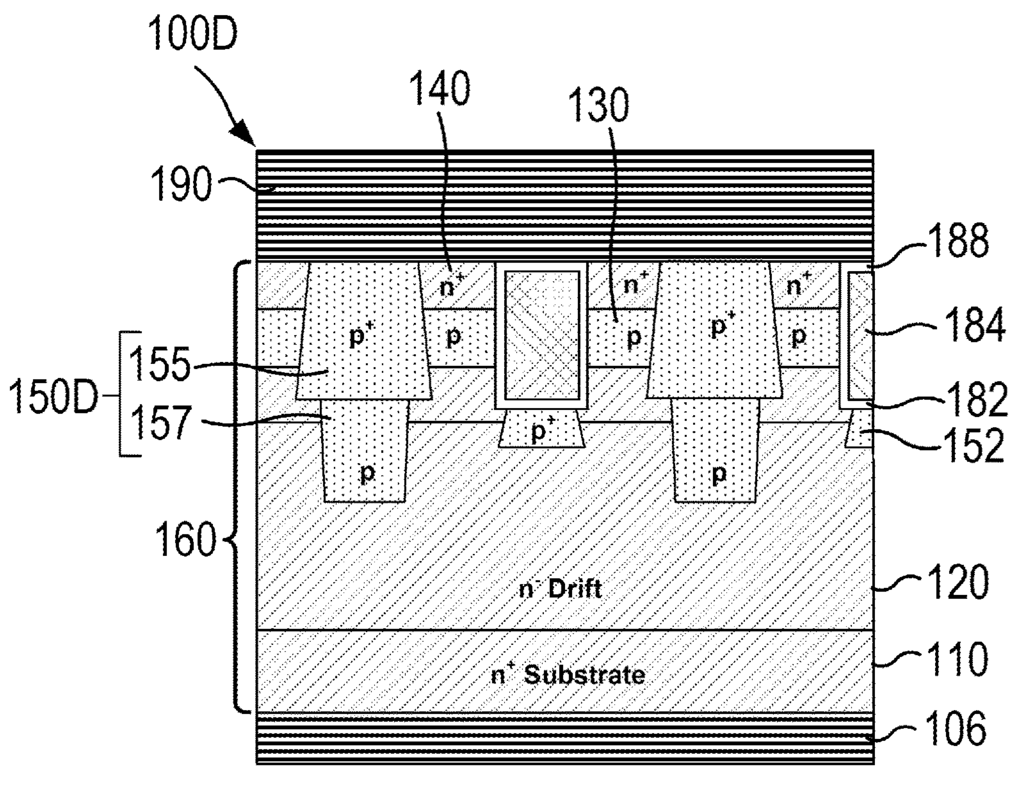

As can be seen by comparing FIG. 3C and FIG. 6D, the only difference between MOSFET 100 and MOSFET 100D is that the p-type support shields 150D in MOSFET 100D are formed using a combination of a relatively lower energy random implant that is designed to implant p-type dopants to a depth, for example, that is less than a depth of the gate trenches 180, and a channeled ion implant that is designed to implant dopants more deeply into the semiconductor layer structure 160. The random implant forms an implanted region 155 that exhibits blooming. The channeled implant forms an implanted region 157. The channeled implant may be formed using a mask having angled sidewalls so that the width of the implanted region 157 decreases with increasing depth into the semiconductor layer structure 160, as shown in FIG. 6D. The channeled implant may be a buried implant that primarily implants dopants in the region 157 or may be a non-buried implant that also implants dopants into the central portion of region 155. One advantage of MOSFET 100D is that the implanted region 155 may easily be implanted to have a high p-type dopant concentration (e.g., $1\times10^{20}$), providing a low resistance contact between the p-type semiconductor material and the source metallization layer 190. Otherwise, MOSFET 100D may be identical to MOSFET 100, so further description thereof will be omitted.

Figure 7:
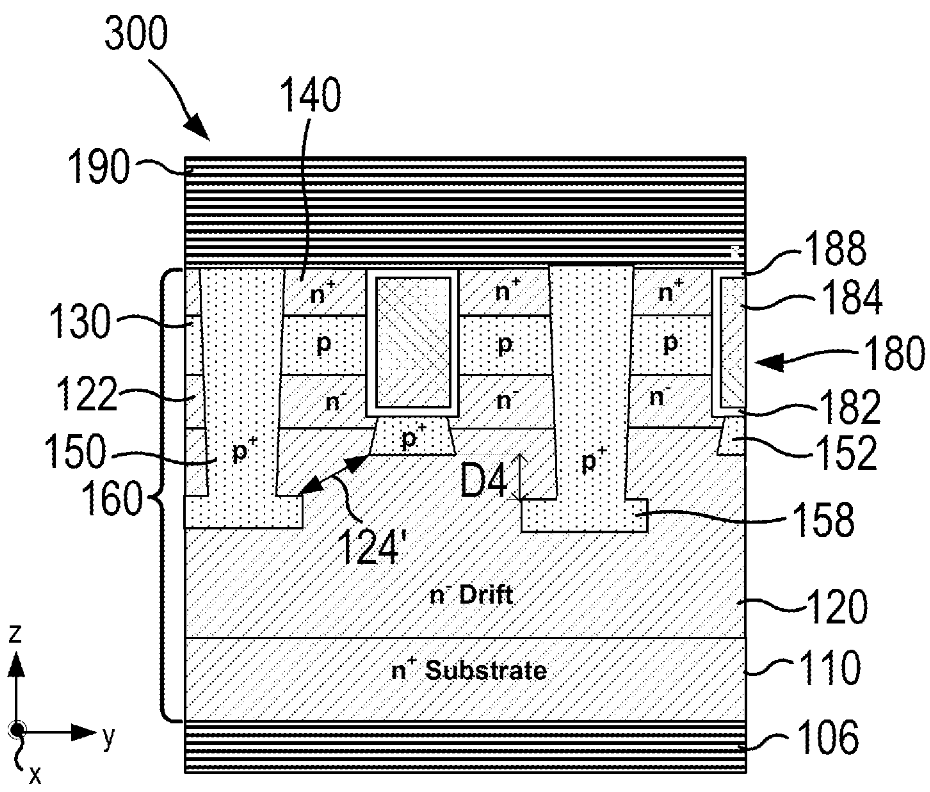
FIG. 7 is a schematic cross-sectional view of a gate trench silicon carbide power MOSFET according to further embodiments of the present invention.

As can be seen by comparing FIG. 3C and FIG. 6E, the only difference between MOSFET 100 and MOSFET 100E is that in MOSFET 100E the support shields 150 extend to a depth D2 that is less than the depth D3 of the trench shielding regions 152. Otherwise, MOSFET 100E may be identical to MOSFET 100, so further description thereof will be omitted FIG. 7 is a schematic cross-sectional view of a gate trench silicon carbide power MOSFET 300 according to further embodiments of the present invention. The gate trench silicon carbide power MOSFET 300 may be identical to the gate trench silicon carbide power MOSFET 100 when viewed in plan view, and hence FIG. 3A also accurately represents power MOSFET 300. The cross-section of FIG. 7 is also taken along the line 3C-3C of FIG. 3A and illustrates how power MOSFET 300 differs from power MOSFET 100. As most of the elements of power MOSFET 300 are the same as the corresponding elements of power MOSFET 100, the same reference numerals are used for those elements in FIGS. 3A-3C and FIG. 7. The description below will focus on the elements of power MOSFET 300 that differ from power MOSFET 100.

As can be seen by comparing FIGS. 3C and 7, power MOSFET 300 differs from power MOSFET 100 in that it includes a plurality of buried lateral support shield extensions 158 in the semiconductor layer structure 160. Each buried lateral support shield extension 158 extends laterally from either side of a bottom portion of a respective one of the support shields 150. Each buried lateral support shield extension 158 has the second conductivity type and may have a doping concentration that may be the same as or different from the doping concentration of the support shields 150.

The buried lateral support shield extensions 158 may be formed, for example, using a high energy random ion implantation process that is performed before or after the ion implantation process that is used to form the support shields 150. By using a high energy channeled ion implantation process, almost all of the dopant ions will pass through the source layer 140, the p-well layer 130 and the JFET region 122 to form a buried implanted region. Since a random (i.e., non-channeled) ion implantation is used, blooming occurs that creates the lateral extensions 158.

As shown in FIG. 7, the buried lateral support shield extensions 158 may be formed relatively deeply within the semiconductor layer structure 160. Consequently, even though the buried lateral support shield extensions 158 extend laterally in the direction of the trench shielding regions 152, the minimum gap (labelled 124' in FIG. 7) that is provided between the support shields 150/buried lateral support shield extensions 158 and the trench shielding regions 152 may be kept relatively large, as shown in FIG. 7. Thus, the buried lateral support shield extensions 158 may provide enhanced protection to the portions of the gate oxide layer 182 in the bottom corners of the gate trenches 180 without negatively impacting the on-state resistance.

As shown in FIG. 7, each section of the JFET region 122 is interposed in the vertical direction (z-direction) in between the drift region 120 and the well region 130, and is interposed in the lateral direction (y-direction) in between the support shield 150 and a gate trench 180. A minimum distance between the buried lateral support shield extension 158 and the trench shield 152 that is closest thereto may be at least as large as a minimum lateral width of the JFET region 122. As a result, the gap 124' does not become a choke point for current flow during on-state operation.

In example embodiments, an upper portion of each buried lateral support shield extension 158 may be between 0.1 and 10 microns below (i.e., deeper into the semiconductor layer structure 160) the lower surfaces of the adjacent trench shielding regions 152. In other embodiments, the upper portion of each buried lateral support shield extension 158 may be between 0.1-3 microns below, 0.2-2 microns below, or 0.2-1 microns below the lower surfaces of the adjacent trench shielding regions 152. This is shown in FIG. 7 by the distance D4 which is the vertical distance between the upper portion of each buried lateral support shield extension 158 and the lower surface of the adjacent trench shielding region 152. In example embodiments, the distance 124' (i.e., the minimum distance between each buried lateral support shield extension 158 and its closest trench shielding region 152) may be between 0.1 and 10 microns. In other embodiments, the distance 124' may be between 0.1-3 microns, between 0.1 and 2 microns, between 0.1-1 microns, or between 0.3-3 microns. In example embodiments, each buried lateral support shield extension 158 may extend laterally for a distance of between 0.1 and 20 microns from the sidewall of its associated support shield 150. In other embodiments, each buried lateral support shield extension 158 may extend laterally for a distance of between 0.1-5 microns, 0.1-3 microns or 0.1-1 microns from the sidewall of its associated support shield 150. In example embodiments, each buried lateral support shield extension 158 may have a thickness of between 0.1 and 20 microns (i.e., in the z-direction). In other embodiments, each buried lateral support shield extension 158 may have a thickness of between 0.1-5 microns, 0.1-3 microns or 0.1-1 microns.

Thus, as shown in FIG. 7, pursuant to some embodiments of the present invention, a MOSFET 300 is provided that comprises a silicon carbide based semiconductor layer structure 360 that comprises a drift region 120 having a first (n) conductivity type, a support shield 150 having a second (p) conductivity type, and a buried lateral support shield extension 158 having the second (p) conductivity type. The buried lateral support shield extension 158 extends laterally from the support shield 150. Herein, the term "vertically" refers to a direction that is perpendicular to the major (upper and lower) surfaces of a semiconductor layer structure such as semiconductor layer structure 160 (i.e., the z-direction in FIG. 7), and the term "laterally" refers to a direction that is perpendicular to both the longitudinal direction of the gate trenches and to the vertical direction (i.e., "the lateral" direction is the y-direction in FIG. 7). The MOSFET 300 further includes a first gate trench 180 extending into an upper surface of the semiconductor layer structure 160.

As shown in FIG. 7, in some embodiments, the semiconductor layer structure 160 may include a trench shielding region 152 that has the second (p) conductivity type. The trench shielding region 152 may be positioned below the first gate trench 180, and an upper surface of the buried lateral support shield extension 158 may be deeper into the semiconductor layer structure 160 than is a bottom surface of the trench shielding region 152. The semiconductor layer structure 160 may also or alternatively include a JFET region 122 that has the first (n) conductivity type. The JFET region 122 (or, more typically, a portion thereof) may be positioned along the vertical direction in between the drift region 120 and the well region 130 and may be positioned in the lateral direction between the support shield 150 and the first gate trench 180. A minimum distance between the buried lateral support shield extension 158 and the trench shielding region 152 is at least as large as a minimum lateral width of the JFET region 122 in the region between the support shield 150 and the first gate trench 180.

As is further shown in FIG. 7, at least a portion of first and second sidewalls of the support shield 150 may angle inwardly with increasing depth into the semiconductor layer structure 160. A wall of the channel implanted buried lateral support shield extension 158 may extend along a crystallographic axis of the silicon carbide semiconductor layer structure 160. In some embodiments, the crystallographic axis along which the sidewall extends is one of the <11-23>, <−1-123>, <1-213>, <−12-13>, <2-1-13> or <−2113> crystallographic axes. In other embodiments, the crystallographic axis along which the sidewall extends is the <0001> crystallographic axis. The sidewall that extends along a crystallographic axis of the silicon carbide semiconductor layer structure 160 may be a sidewall that is positioned at an end of the buried lateral support shield extension 158. In some embodiments, the sidewalls of support shield 150 do not extend along a crystallographic axis of the silicon carbide semiconductor layer structure. For example, the support shields 150 may be formed using a standard (random) ion implantation, while the buried lateral support shield extension 158 may be formed using a channeled ion implantation process. As shown in FIG. 7, at least a portion of first and second sidewalls of each support shield 150 may angle inwardly with increasing depth into the semiconductor layer structure 160. As discussed above, support shields 150 having such a shape may be formed by using an ion implantation mask that has angled sidewalls during the ion implantation step used to form the support shields 150.

To form the device shown in FIG. 7, a channeled ion implantation process may be used to form the support shields 150. As discussed above, a mask having angled sidewalls that define the openings therein may be used during this implantation process so that the long sidewalls of each support shield 150 angle inwardly as the support shields extend deeper into the semiconductor layer structure 160.

Figure 8A:
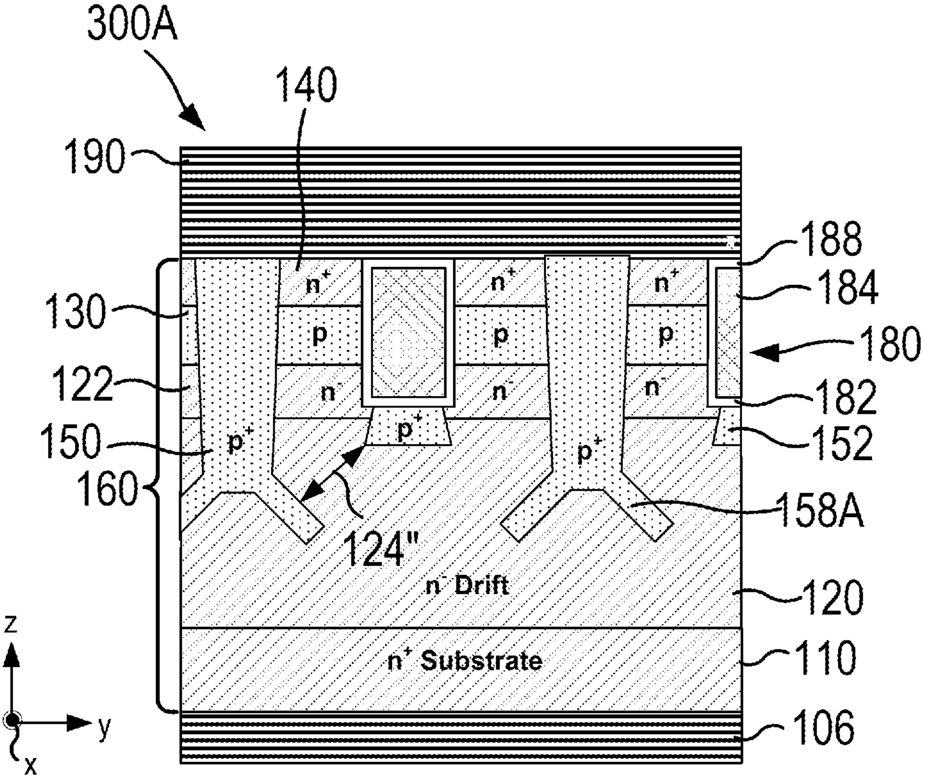
FIGS. 8A-8C are schematic cross-sectional views of three modified versions of the gate trench silicon carbide power MOSFET of FIG. 7.
Figure 8B:
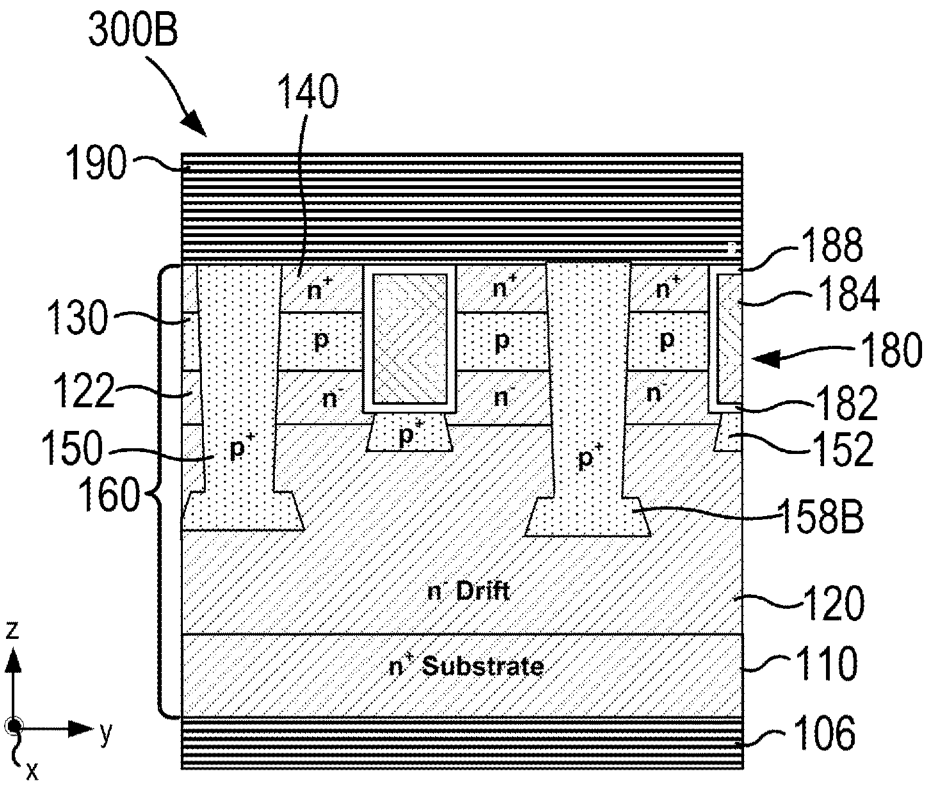
Figure 8C:
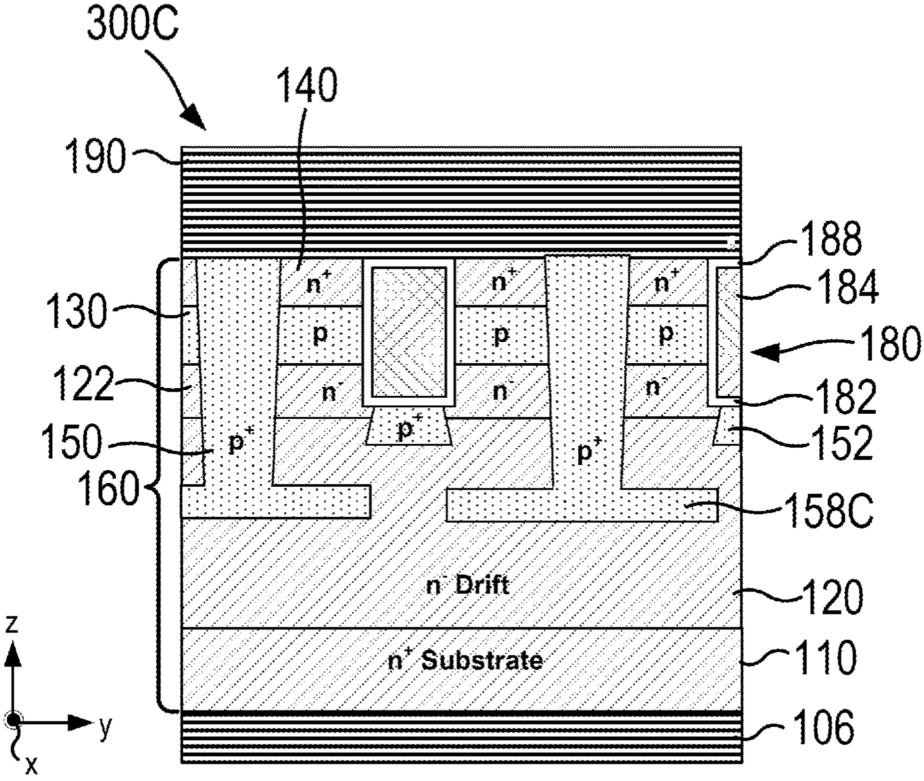

FIGS. 8A-8C are schematic cross-sectional views of gate trench silicon carbide power MOSFETs 300A-300C, respectively, that are modified versions of the gate trench silicon carbide power MOSFET 300.

Gate trench silicon carbide power MOSFETs 300A-300C are almost identical to power MOSFET 300, but include buried lateral support shield extensions 158A-158C that have different designs. As shown in FIG. 8A, in MOSFET 300A, the buried lateral support shield extensions 158A each comprise a generally rectangular region that extends at an angle of about-/+45° from a bottom corner of a support shield 150. The lengths of the buried lateral support shield extensions 158A may be varied from the length shown in FIG. 8A, as may the angles at which the buried lateral support shield extensions 158A extend from the bottom corners of the support shields 150. This design may allow for an even larger minimum gap 124". FIG. 8B illustrates a MOSFET 300B that has buried lateral support shield extensions 158B that have yet another shape to illustrate that the size, shape, orientation, etc. of the buried lateral support shield extensions may be varied to improve electric field blocking during reverse bias operation and/or on-state resistance. As shown in FIG. 8C, MOSFET 300C has buried lateral support shield extensions 158C that extend much farther laterally so that the vertically overlap the gate trenches 180 and/or the trench shielding regions 152. This design may improve electric field blocking during reverse bias operation and/or on-state resistance.

Figure 9A:
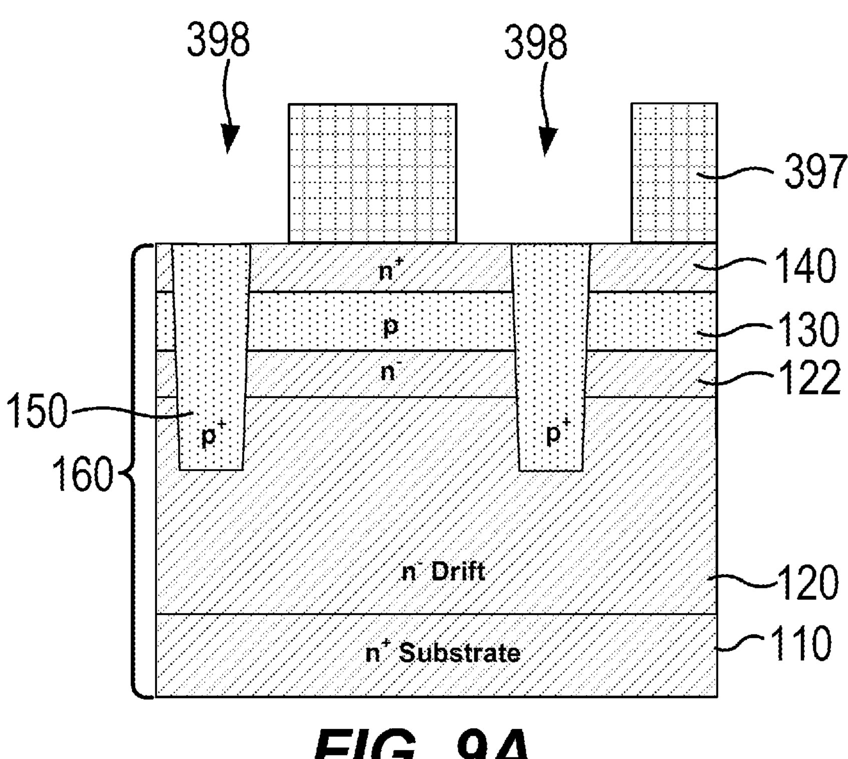
FIGS. 9A and 9B are schematic cross-sectional views which, along with FIGS. 4A-4B, illustrate a method of fabricating the gate trench silicon carbide power MOSFET of FIG. 7.
Figure 9B:
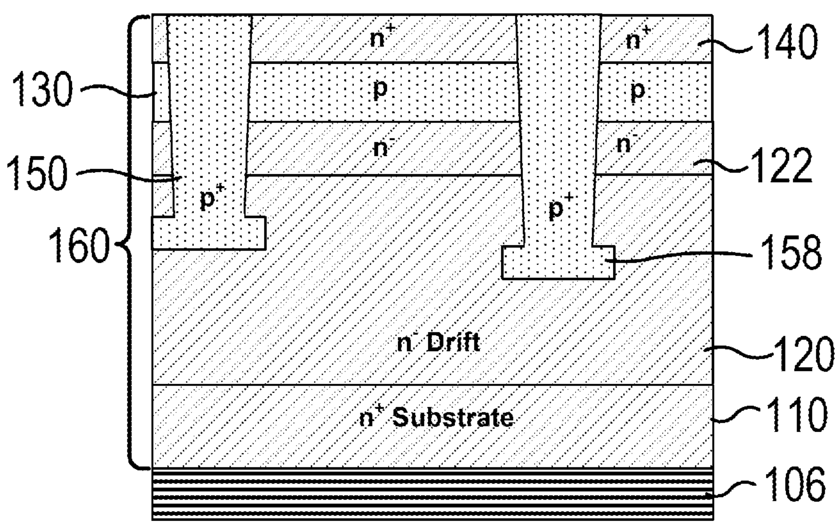

FIGS. 9A and 9B are schematic cross-sectional views which, along with FIGS. 4A-4C, illustrate a method of fabricating the gate trench silicon carbide power MOSFET of FIG. 7.

Referring first to FIGS. 4A-4C, the device illustrated in FIG. 4C may be formed in the manner described above. Next, referring to FIG. 9A, a mask layer such as, for example, an oxide mask is formed on the upper surface of the semiconductor layer structure 160 and is then patterned (e.g., using standard photolithography patterning techniques) to form a patterned mask 397 that has openings 398 therein that expose selected portions of the semiconductor layer structure 160. The openings 398 are positioned above locations in the semiconductor layer structure 160 in which the buried lateral support shield extensions 158 will be formed in a subsequent processing step. Next, referring to FIG. 9B, a high energy random ion implantation process is performed to form the buried lateral support shield extensions 158. The processing steps discussed above with reference to FIG. 4E may then be performed to complete the MOSFET 300 of FIG. 7.

As described above, one technique for forming support shields that have first and second opposed sidewalls that angle inwardly with increasing depth into the semiconductor layer structure is to use a channeled ion implantation process to form the support shields and using an ion implantation mask that has openings with angled sidewalls. It will be appreciated, however, that embodiments of the present invention are not limited thereto. For example, in other embodiments, the p-type support shields may be formed to have first and second opposed sidewalls that angle outwardly with increasing depth into the semiconductor layer structure, and either before or after this ion implantation process, n-type dopants are implanted into the semiconductor layer structure using a buried random ion implantation process. The blooming with depth that occurs with increasing depth with the random ion implantation process implants dopants into the outer edges of the support shield that compensate the p-type dopants, thereby converting outer edges of the support shields into n-type semiconductor material. The extend to which this occurs increases with increasing depth as the blooming increases with increasing depth.

FIGS. 10A-10C illustrate this technique. As shown in FIG. 10A, a support shield 400 having first and second opposed sidewalls that angle outwardly with increasing depth is formed using a channeled ion implantation process to implant p-type dopants into a semiconductor layer structure 460. As discussed above, this may form an implanted region 400 having relatively vertical sidewalls. Referring to FIG. 10B, a patterned ion implantation mask 410 is formed, and then a high energy random ion implantation process is used to implant n-type dopants into the semiconductor layer structure in the regions 420. Since a random ion implantation process is used, regions 420 exhibit blooming so that the sidewalls thereof angle outwardly with increasing depth into the semiconductor layer structure 460. As shown in FIG. 10C, if the dopant concentration of the n-type dopants that are implanted in the second ion implantation step exceeds the dopant concentration of the p-type dopants that are implanted in the first ion implantation step, then the regions 420 will have n-type conductivity. In this manner, a support shield in which at least a portion of the first and second sidewalls thereof angle inwardly with increasing depth may be formed.

Embodiments of the present invention are primarily described above with respect to cross-sectional diagrams. It will be appreciated that in each of the depicted embodiments of the present invention the support shields (e.g., 150), the trench shielding regions 152, the gate trenches 180, etc. may be elongated structures that extend continuously into the page in the figures across the active region of the semiconductor devices. However, it will also be appreciated that the support shields (e.g., 150) and/or the trench shielding regions 152 may instead be segmented structures in other embodiments that have sections removed so that these structures do not extend continuously into the pages in the figures, but instead are structures with multiple collinear segments extending into the page.

In the description above, each example embodiment has a certain conductivity type. It will be appreciated that opposite conductivity type devices may be formed by simply reversing the conductivity of the n-type and p-type layers in each of the above embodiments. Thus, it will be appreciated that the present invention covers both n-channel and p-channel devices for each different device structure (e.g., MOSFET, IGBT, etc.).

The present invention has primarily been discussed above with respect to silicon carbide based power semiconductor devices. It will be appreciated, however, that silicon carbide is used herein as an example and that the devices discussed herein may be formed in any appropriate wide band-gap semiconductor material system. As an example, gallium nitride based semiconductor materials (e.g., gallium nitride, aluminum gallium nitride, etc.) may be used instead of silicon carbide in any of the embodiments described above.

Embodiments of the present invention have been described above with reference to the accompanying drawings, in which embodiments of the invention are shown. It will be appreciated, however, that this invention may, however, be embodied in many different forms and should not be construed as limited to the embodiments set forth above. Rather, these embodiments are provided so that this disclosure will be thorough and complete, and will fully convey the scope of the invention to those skilled in the art. Like numbers refer to like elements throughout.

Herein, the term "plurality" means two or more. Herein, "substantially" means within +/−10%.

It will be understood that, although the terms first, second, etc. are used throughout this specification to describe various elements, these elements should not be limited by these terms. These terms are only used to distinguish one element from another. For example, a first element could be termed a second element, and, similarly, a second element could be termed a first element, without departing from the scope of the present invention. The term "and/or" includes any and all combinations of one or more of the associated listed items.

The terminology used herein is for the purpose of describing particular embodiments only and is not intended to be limiting of the invention. As used herein, the singular forms "a", "an" and "the" are intended to include the plural forms as well, unless the context clearly indicates otherwise. It will be further understood that the terms "comprises" "comprising," "includes" and/or "including" when used herein, specify the presence of stated features, integers, steps, operations, elements, and/or components, but do not preclude the presence or addition of one or more other features, integers, steps, operations, elements, components, and/or groups thereof.

It will be understood that when an element such as a layer, region or substrate is referred to as being "on" or extending "onto" another element, it can be directly on or extend directly onto the other element or intervening elements may also be present. In contrast, when an element is referred to as being "directly on" or extending "directly onto" another element, there are no intervening elements present. It will also be understood that when an element is referred to as being "connected" or "coupled" to another element, it can be directly connected or coupled to the other element or intervening elements may be present. In contrast, when an element is referred to as being "directly connected" or "directly coupled" to another element, there are no intervening elements present.

Relative terms such as "below" or "above" or "upper" or "lower" or "top" or "bottom" may be used herein to describe a relationship of one element, layer or region to another element, layer or region as illustrated in the figures. It will be understood that these terms are intended to encompass different orientations of the device in addition to the orientation depicted in the figures.

Embodiments of the invention are described herein with reference to cross-section illustrations that are schematic illustrations of idealized embodiments (and intermediate structures) of the invention. The thickness of layers and regions in the drawings may be exaggerated for clarity. Additionally, variations from the shapes of the illustrations as a result, for example, of manufacturing techniques and/or tolerances, are to be expected. Embodiments of the invention are also described with reference to a flow chart. It will be appreciated that the steps shown in the flow chart need not be performed in the order shown.

Some embodiments of the invention are described with reference to semiconductor layers and/or regions which are characterized as having a conductivity type such as n-type or p-type, which refers to the majority carrier concentration in the layer and/or region. Thus, n-type material has a majority equilibrium concentration of negatively charged electrons, while p-type material has a majority equilibrium concentration of positively charged holes. Some material may be designated with a "+" or "−" (as in n+, n−, p+, p−, n++, n−−, p++, p−−, or the like), to indicate a relatively larger ("+") or smaller ("−") concentration of majority carriers compared to another layer or region. However, such notation does not imply the existence of a particular concentration of majority or minority carriers in a layer or region.

In the drawings and specification, there have been disclosed typical embodiments of the invention and, although specific terms are employed, they are used in a generic and descriptive sense only and not for purposes of limitation, the scope of the invention being set forth in the following claims.

The invention claimed is:

1. A semiconductor device, comprising:

a semiconductor layer structure that comprises a drift region having a first conductivity type, a well layer having a second conductivity type, and a support shield having the second conductivity type; and a first gate trench in an upper portion of the semiconductor layer structure, wherein a width of a first portion of the support shield decreases with increasing distance from the well region, and wherein the first portion of the support shield comprises a portion that is deeper in the semiconductor layer structure than the well layer and less deep in the semiconductor layer structure than a bottom of the first gate trench.

2. The semiconductor device of claim 1, wherein an entirety of the support shield that is deeper in the semiconductor layer structure than the well layer has a width that decreases with increasing distance from the well region.

3. The semiconductor device of claim 1, wherein the semiconductor device comprise a MOSFET, and the semiconductor layer structure further comprises a source layer having the first conductivity type on the well layer, and wherein a gate oxide layer and a gate electrode are in the first gate trench, with the gate oxide layer between the gate electrode and the semiconductor layer structure.

4. The semiconductor device of claim 3, wherein a maximum width of a portion of the support shield that horizontally overlaps the source region is at least 10% larger than a width of a portion of the support shield that horizontally overlaps a bottom of the first gate trench.

5. The semiconductor device of claim 1, wherein a bottom of the first gate trench has a first depth from the upper portion of the semiconductor layer structure and a bottom of the support shield has a second depth from the upper portion of the semiconductor layer structure, where the second depth is greater than the first depth.

6. The semiconductor device of claim 5, wherein the semiconductor layer structure further comprises a trench shielding region having the second conductivity type below the first gate trench, where a bottom of the trench shielding region has a third depth from the upper portion of the semiconductor layer structure, and wherein the second depth is greater than the third depth.

7. The semiconductor device of claim 6, wherein the semiconductor layer structure further comprises a buried support shield extension that extends laterally from the support shield.

8. A semiconductor device, comprising:

a semiconductor layer structure that comprises a drift region having a first conductivity type, a well layer having a second conductivity type, and a support shield having the second conductivity type; and a first gate trench in an upper portion of the semiconductor layer structure, wherein a width of a first portion of the support shield decreases with increasing distance from the well region, wherein a support shield trench is provided in the semiconductor layer structure that extends at least part of the way in the support shield, and conductive material other than silicon carbide is in the support shield trench.

9. A semiconductor device, comprising:

a semiconductor layer structure that comprises a drift region having a first conductivity type, a JFET region having the first conductivity type on an upper portion of the drift region, the JFET region having a higher first conductivity type doping concentration than the drift region, a well layer having a second conductivity type on an upper portion of the JFET region, and a support shield having the second conductivity type; and a first gate trench in an upper portion of the semiconductor layer structure;

wherein a first portion of the JFET region that is in between the first gate trench and the support shield has a width that increases with increasing distance from the well layer.

10. The semiconductor device of claim 9, wherein at least a portion of the support shield has a width that decreases with increasing distance from the upper portion of the semiconductor layer structure.

11. The semiconductor device of claim 9, further comprising a second gate trench extending into the upper portion of the semiconductor layer structure, wherein the support shield is in between the first and second gate trenches.

12. The semiconductor device of claim 9, wherein a bottom of the first gate trench has a first depth from the upper portion of the semiconductor layer structure and a bottom of the support shield has a second depth from the upper portion of the semiconductor layer structure, where the second depth is greater than the first depth.

13. The semiconductor device of claim 12, wherein the semiconductor layer structure further comprises a trench shielding region having the second conductivity type below the first gate trench, wherein a bottom of the trench shielding region has a third depth from the upper portion of the semiconductor layer structure, and wherein the second depth is greater than the third depth.

14. The semiconductor device of claim 13, wherein the semiconductor layer structure further comprises a buried support shield extension that extends laterally from the support shield.

15. The semiconductor device of claim 9, wherein a support shield trench is provided in the semiconductor layer structure that extends at least part of the way through the support shield, and conductive material other than silicon carbide is in the support shield trench.

16. The semiconductor device of claim 15, wherein the conductive material comprises one of doped polysilicon, nickel oxide, or a metal that makes a Schottky contact to silicon carbide.

17. The semiconductor device of claim 16, wherein the support shield trench does not extend through a bottom portion of the support shield.

18. A semiconductor device, comprising:

a semiconductor layer structure that comprises a drift region having a first conductivity type, a support shield having the second conductivity type, and a buried lateral support shield extension having the second conductivity type that extends laterally from the support shield; and a first gate trench in an upper portion of the semiconductor layer structure, wherein a sidewall of the support shield extends along a crystallographic axis of the semiconductor layer structure.

19. The semiconductor device of claim 18, wherein sidewalls of buried lateral support shield extension do not extend along a crystallographic axis of the silicon carbide semiconductor layer structure.

20. The semiconductor device of claim 18, wherein at least a portion of first and second sidewalls of the support shield angle inwardly with increasing depth into the semiconductor layer structure.

21. The semiconductor device of claim 18, wherein the semiconductor layer structure further comprises a JFET region having the first conductivity type in between the drift region and the well region and in between the support shield and the first gate trench, wherein a minimum distance between the buried lateral support shield extension and the trench shield is at least as large as a minimum lateral width of the JFET region.

22. The semiconductor device of claim 18, wherein the semiconductor layer structure further comprises a trench shielding region having the second conductivity type below the first gate trench, and an upper portion of the support shield extension is deeper into the semiconductor layer structure than is a bottom surface of the trench shielding region.

* * * * *